United States Patent [19]
Haga

[11] Patent Number: 6,104,646
[45] Date of Patent: *Aug. 15, 2000

[54] SEMICONDUCTOR MEMORY DEVICE HAVING REDUNDANCY CIRCUIT WITH HIGH RESCUE EFFICIENCY

[75] Inventor: Ryo Haga, Yokohama, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/139,268

[22] Filed: Aug. 25, 1998

[30] Foreign Application Priority Data

Aug. 28, 1997 [JP] Japan ..................................... 9-232397

[51] Int. Cl.[7] ..................................................... G11C 7/00
[52] U.S. Cl. ........................ 365/200; 365/189.07; 365/51
[58] Field of Search ............................. 365/200, 189.07, 365/51, 63, 189.01

[56] References Cited

U.S. PATENT DOCUMENTS

| | | | |
|---|---|---|---|
| 5,295,101 | 3/1994 | Stephens, Jr. et al. | 365/200 |
| 5,307,316 | 4/1994 | Takemae | 365/200 |
| 5,414,660 | 5/1995 | Sugibayashi et al. | 365/200 |
| 5,497,347 | 3/1996 | Feng | 365/189.07 |
| 5,617,364 | 4/1997 | Hatakeyama | 365/200 |
| 5,841,709 | 11/1998 | McClure | 365/200 |

*Primary Examiner*—David Nelms
*Assistant Examiner*—Hoai V. Ho
*Attorney, Agent, or Firm*—Banner & Witcoff, Ltd.

[57] ABSTRACT

There is disclosed a memory cell array including regular and redundant memory cells, a plurality of bit lines connected to the regular memory cells, a plurality of redundant bit lines connected to the redundant memory cells, a regular data line commonly coupled to the plurality of regular bit lines, and a redundant data line commonly coupled to the plurality of redundant bit lines. Column selection lines include regular column selection lines for selecting regular bit lines, and redundant column selection lines for selecting redundant bit lines. Furthermore, the number of redundant column selection lines is smaller than that of the regular column selection lines.

20 Claims, 22 Drawing Sheets

| | COLUMN ADDRESS (FOR CSLD) | | |
|---|---|---|---|
| | AC0 | AC1 | AC2 |
| CSL1 | L | L | L |
| CSL2 | H | L | L |
| CSL3 | L | H | L |
| CSL4 | H | H | L |
| CSL5 | L | L | H |
| CSL6 | H | L | H |
| CSL7 | L | H | H |
| CSL8 | H | H | H |

| | REPLACING COLUMN ADDRESS INFORMATION | |
|---|---|---|
| | FUL0 | FUL1 |
| CSL1 | L (No Cut) | L (No Cut) |
| CSL2 | L (No Cut) | L (No Cut) |
| CSL3 | H (Cut) | L (No Cut) |
| CSL4 | H (Cut) | L (No Cut) |
| CSL5 | L (No Cut) | H (Cut) |
| CSL6 | L (No Cut) | H (Cut) |
| CSL7 | H (Cut) | H (Cut) |
| CSL8 | H (Cut) | H (Cut) |

| | COLUMN ADDRESS (FOR RCSLD) | |
|---|---|---|
| | AC1 | AC2 |
| RCSL1 | L | L |
| RCSL2 | H | L |
| RCSL3 | L | H |
| RCSL4 | H | H |

SEMICONDUCTOR MEMORY DEVICE HAVING REDUNDANCY CIRCUIT WITH HIGH RESCUE EFFICIENCY

BACKGROUND OF THE INVENTION

The present invention relates to a semiconductor memory device having a redundancy circuit for rescuing failed memory cells, which is used in, e.g., a DRAM (dynamic memory).

FIG. 1 is a block diagram of a DRAM using an overlaid DQ scheme.

As shown in FIG. 1, in the DRAM using the overlaid DQ scheme, complementary data lines DQ and BDQ (to be referred to as data line pairs or pairs of data lines in this specification) run on a memory cell array/sense amplifier region 1 and a column selector region 2 in a direction parallel to complementary bit lines BL and BBL (to be referred to as bit line pairs or pairs of bit lines in this specification).

FIG. 1 shows two pairs of data lines DQ1 and BDQ1, and DQ2 and BDQ2.

A plurality of pairs (eight pairs in FIG. 1) of bit lines BL1 and BBL1 to BL8 and BBL8 are commonly connected to the pair of data lines DQ1 and BDQ1 via column selection transistors CQ1-1 to CQ8-1.

Similarly, a plurality of pairs (eight pairs in FIG. 1) of bit lines BL9 and BBL9 to BL16 to BBL16 are commonly connected to the pair of data lines DQ2 and BDQ2 via column selection transistors CQ1-2 and CQ8-2.

The gates of the column selection transistors CQ1-1 and CQ1-2 are connected to a column selection line CSL1, the gates of the column selection transistors CQ2-1 and CQ2-2 to a column selection line CSL2, . . . , and the gates of the column selection transistors CQ8-1 and CQ8-2 to a column selection line CSL8, respectively. These column selection transistors CQ1-1 to CQ8-1 and CQ1-2 to CQ8-2 are turned on/off in correspondence with the potentials on the column selection lines CSL1 to CSL8.

In such DRAM, a column including a failed memory cell is normally rescued by replacing it by a redundant column together with a pair of data lines DQ and BDQ.

More specifically, as shown in FIG. 1, a pair of redundant data lines RDQ and RBDQ run in addition to the pair of regular data lines DQ and BDQ. Eight pairs of redundant bit lines RBL1 and BRBL1 to RBL8 and BRBL8 are commonly connected to the pair of redundant data lines RDQ and BRDQ via redundant column selection transistors RCQ1 to RCQ8.

The gate of the redundant column selection transistor RCQ1 is connected to the column selection line CSL1, the gate of the redundant column selection transistor RCQ2 to the column selection line CSL2, . . . , and the gate of the redundant column selection transistor RCQ8 to the column selection line CSL8, respectively. These redundant column selection transistors RCQ1 to RCQ8 are turned on/off in correspondence with the potentials on the column selection lines CSL1 to CSL8.

In the above-mentioned conventional DRAM, when a column including a failed memory cell is selected, a pair of redundant data lines RDQ and RBDQ are selected in place of the pair of regular data lines DQ and BDQ.

However, in the conventional DRAM, one of the pair of regular data lines DQ1 and BDQ1, and the pair of regular data lines DQ2 and BDQ2 can only be rescued.

In addition, in recent DRAMs, the number of pairs of bit lines BL and BBL connected to the pair of regular data lines DQ and BDQ increases, and the probability of failures in both the pairs of regular data lines DQ1 and BDQ1, and DQ2 and BDQ2 is very high. For this reason, the conventional DRAM has poor rescue efficiency.

In order to improve the rescue efficiency, the present applicant has proposed a rescue method of dividing the pairs of regular bit lines BL and BBL connected to the pair of regular data lines DQ and BDQ, and the pairs of redundant bit lines RBL and BRBL connected to the pair of redundant data lines RDQ and RBDQ into two groups, and rescuing a failed memory cell in units of groups (Japanese Patent Laid-Open No. 8-221998). FIG. 2 shows a DRAM using this rescue method.

The difference between the improved DRAM shown in FIG. 2 and the DRAM shown in FIG. 1 lies in that pairs of regular bit lines BL1 and BBL1 to BL8 and BBL8, pairs of regular bit lines BL9 and BBL9 to BL16 and BBL16, and the pairs of redundant bit lines RBL1 and BRBL1 to RBL8 and BRBL8 are respectively divided into two groups A and B each including four bit line pairs.

The pairs of redundant bit lines RBL1 and BRBL1 to RBL4 and BRBL4 (group A) are used for rescuing the pairs of regular bit lines BL1 and BBL1 to BL4 and BBL4, or BL9 and BBL9 to BL12 and BBL12.

On the other hand, the pairs of redundant bit lines RBL5 and BRBL5 to RBL8 and BRBL8 (group B) are used for rescuing the pairs of regular bit lines BL5 and BBL5 to BL8 and BBL8, or BL13 and BBL13 to BL16 and BBL16.

In this improved DRAM, even when failures have been produced in both the pairs of regular data lines DQ1 and BDQ1, and DQ2 and BDQ2, they can be rescued if failed memory cells are separately present in groups A and B.

However, in the improved DRAM, the column selection lines CSL1 to CSL8 are shared by the pairs of redundant bit lines RBL1 and BRBL1 to RBL8 and BRBL8, and the pairs of regular bit lines BL1 and BBL1 to BL16 and BBL16, as in the DRAM shown in FIG. 1.

For this reason, if failed memory cells are present in an identical group, rescue cannot be done.

As described above, even in the improved DRAM, an unrescuable case often takes place, and the rescue efficiency is not always improved.

BRIEF SUMMARY OF THE INVENTION

The present invention has been made in consideration of the above situation, and has as its object to provide a semiconductor memory device which can improve the rescue efficiency by reducing unrescuable cases.

In order to achieve the above object, according to the present invention, a semiconductor memory device comprises a memory cell array having a plurality of memory cells arranged in a matrix, the plurality of memory cells including regular memory cells and redundant memory cells for failure rescue; a plurality of regular bit lines connected to the regular memory cells; a plurality of redundant bit lines connected to the redundant memory cells; a regular data line commonly coupled to the plurality of regular bit lines; a redundant data line commonly coupled to the plurality of redundant bit lines; a regular column selection circuit for selecting one of the regular bit lines connecting to the regular data line; and a redundant column selection circuit for selecting one of the redundant data lines connecting to the redundant data line, the number of redundant bit lines selected by the redundant column selection circuit being smaller than the number of bit lines selected by the regular column selection circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

The preferred embodiments of the present invention will be described in detail hereinafter with reference to the accompanying drawings.

[First Embodiment]

Figure 3:
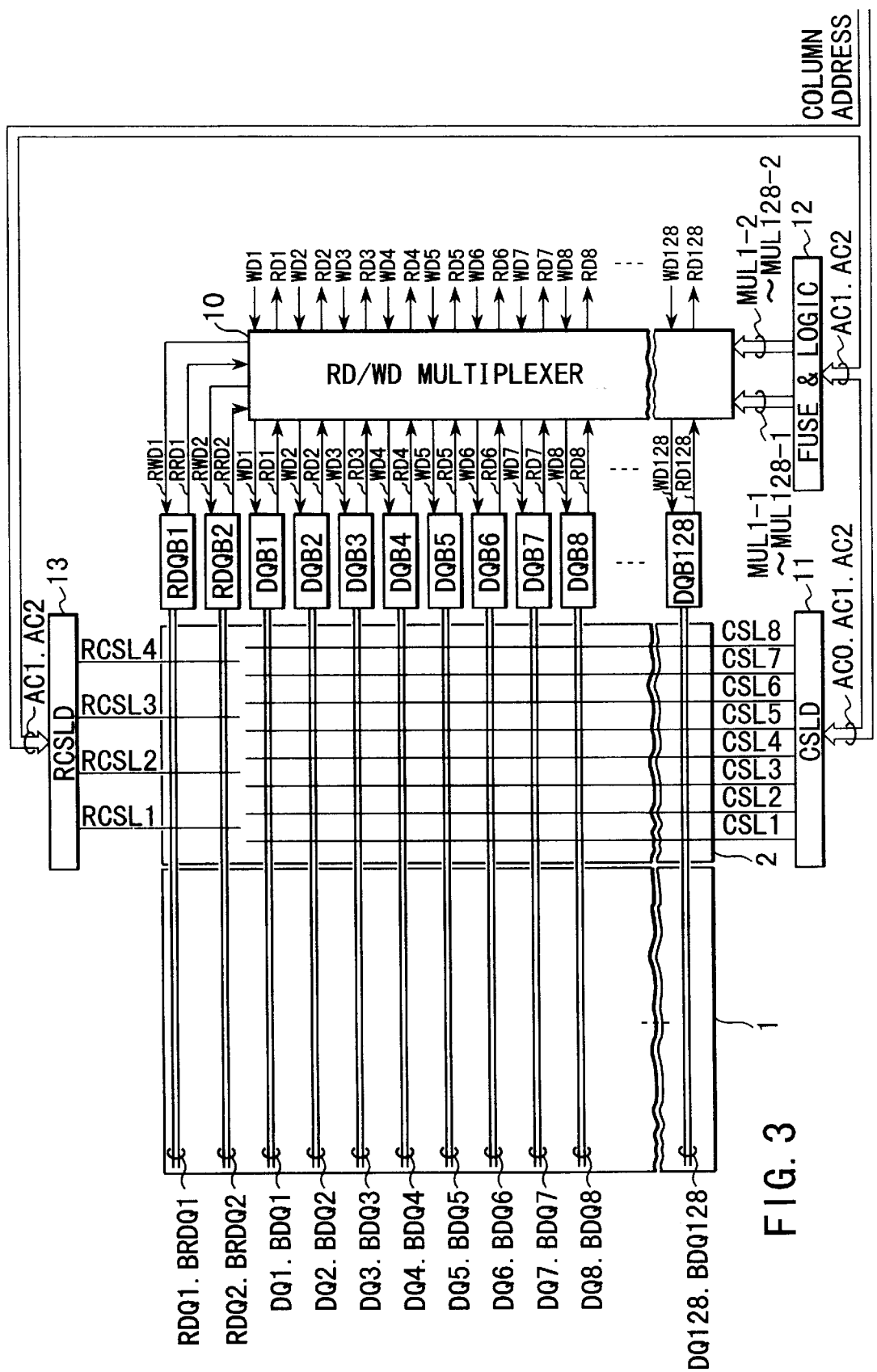
FIG. 3 is a block diagram of a DRAM according to the first embodiment of the present invention.

FIG. 3 is a block diagram showing a DRAM according to the first embodiment of the present invention.

As shown in FIG. 3, a DRAM according to the first embodiment has 128 read data lines RD1 to RD128, and 128 write data lines WD1 to WD128. The read data lines RD1 to RD128 are wires used for transmitting data read out from memory cells. The readout data are output to a device outside the DRAM chip via the read data lines RD1 to RD128. The write data lines WD1 to WD128 are wires for transmitting data to be written in memory cells. Write data input from a device outside the DRAM chip are supplied to the memory cells via the write data lines WD1 to WD128. Each of the read data lines RD1 to RD128 and write data lines WD1 to WD128 of the DRAM according to the first embodiment is constructed by a single wire. Data is determined by the potential on that single wire.

The read data line RD1 and write data line WD1 are connected to a data line buffer DQB1 via an RD/WD multiplexer 10, . . . , and the read data line RD128 and write data line WD128 to a data line buffer DQB128 via the RD/WD multiplexer 10.

The data line buffer DQB1 is connected to a pair of data lines DQ1 and BDQ1, . . . , and the data line buffer DQB128 to a pair of data lines DQ128 and BDQ128. These 128 pairs of data lines DQ1 and BDQ1 to DQ128 and BDQ128 are regular data line pairs. Each pair of the pairs of data lines DQ1 and BDQ1 to DQ128 and BDQ128 consist of two wires. One of the two wires is electrically connected to a memory cell (to be described later), and the remaining one is used for potential reference ("complement data"). That is, data on the pairs of data lines DQ1 and BDQ1 to DQ128 and BDQ128 are complementary data consisting of "true data" and "complement data". For this reason, the data line buffers DQB1 to DBQ128 of the first embodiment convert the complementary data on the pairs of data lines DQ1 and BDQ1 to DQ128 and BDQ128 into data of "true data" alone, and supply the converted data to the read data lines RD1 to RD128. Also, the buffers convert data of "true data" alone on the write data lines WD1 to WD128 into complementary data, and supply the converted data onto the pairs of data lines DQ1 and BDQ1 to DQ128 and BDQ128.

Figure 4:
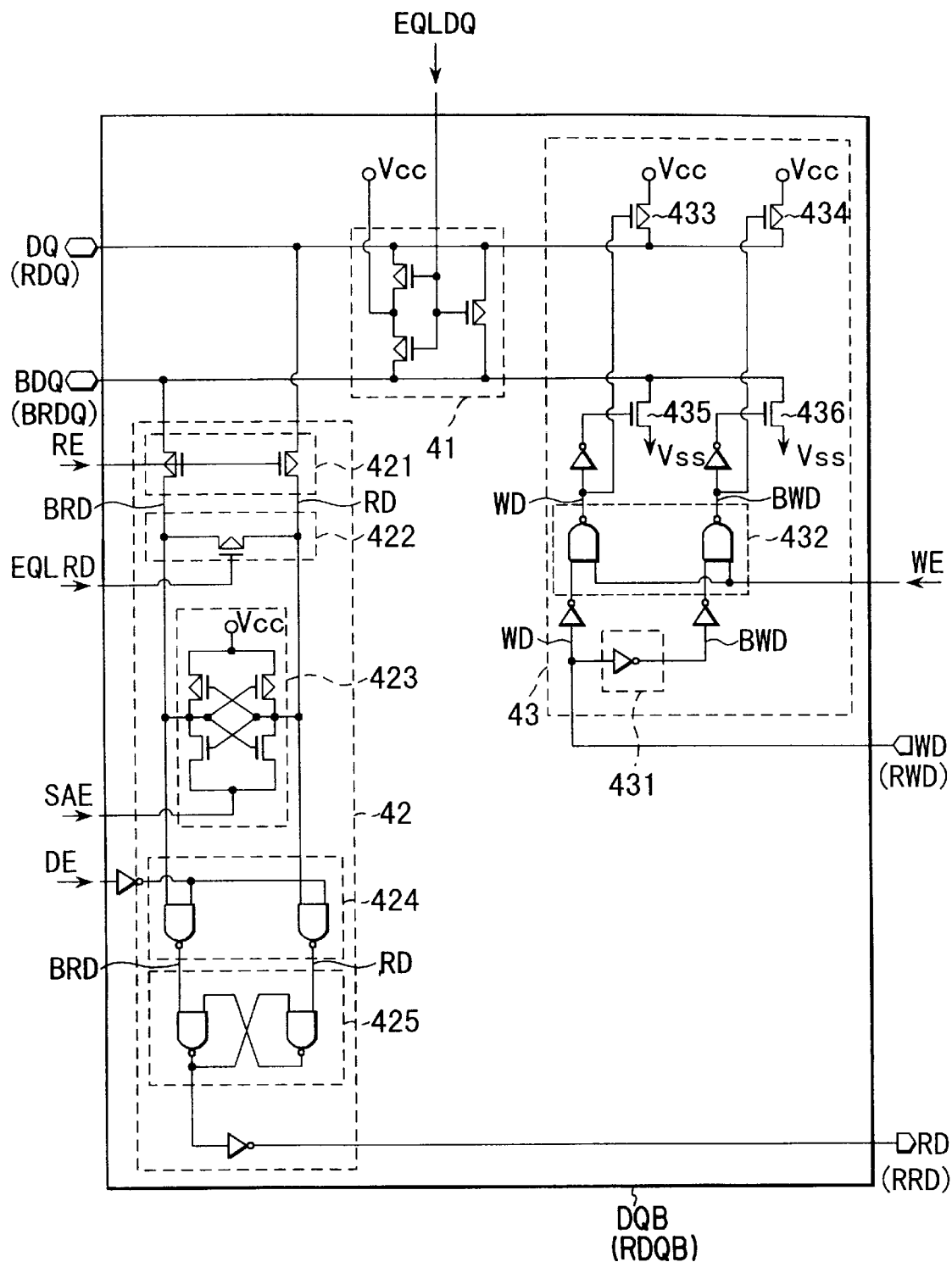
FIG. 4 is a circuit diagram of a data line buffer.

FIG. 4 is a circuit diagram showing a circuit example of the data line buffer DQB.

As shown in FIG. 4, the data line buffer DQB includes a precharge/equalize circuit 41, read buffer circuit 42, and write buffer circuit 43.

The precharge/equalize circuit 41 precharges the pair of data lines DQ and BDQ to a potential VCC in accordance with a data line pair equalize signal EQLDQ, and also equalizes the potential difference across the pair of data lines DQ and BDQ to the potential VCC.

The read buffer circuit 42 includes a transfer gate circuit 421, equalize circuit 422, read data line pair sense amplifier 423, enable circuit 424, and flip-flop circuit 425. The transfer gate circuit 421 connects the pair of data lines DQ and BDQ to a pair of read lines RD and BRD in accordance with a read enable signal RE. The equalize circuit 422 equalizes the potential difference across the pair of read data lines RD and BRD in accordance with a read data line equalize signal EQLRD. The lead data line pair sense amplifier 423 amplifies the potential difference across the pair of read data lines RD and BRD in accordance with a sense amplifier enable signal SAE. The sense amplifier 423 is of latch type. The enable circuit 424 connects the read data line RD to the first input of the flip-flop circuit 425 and connects the inverted read data line BRD to the second input of the flip-flop circuit 425 in accordance with a data enable signal DE. The flip-flop circuit 425 converts complementary data on the pair of read data lines RD and BRD into data of "true data" alone, and supplies it to the read data line RD.

The write buffer circuit 42 includes an inverter 431 and enable circuit 432. The input of the inverter 431 is connected to the write data line WD, and its output is connected to the inverted write data line BWD. The inverter 431 converts data of "true data" alone on the line data line WD into complementary data. The enable circuit 432 connects the pairs of write data lines WD and BWD to the pair of data lines DQ and BDQ in accordance with a write enable signal WE. The pairs of data lines DQ1 and BDQ1 to DQ128 and BDQ128 respectively run above a memory cell/sense amplifier region 1 and column selector region 2. That is, the DRAM according to the first embodiment uses the overlaid DQ line scheme.

Figure 5:
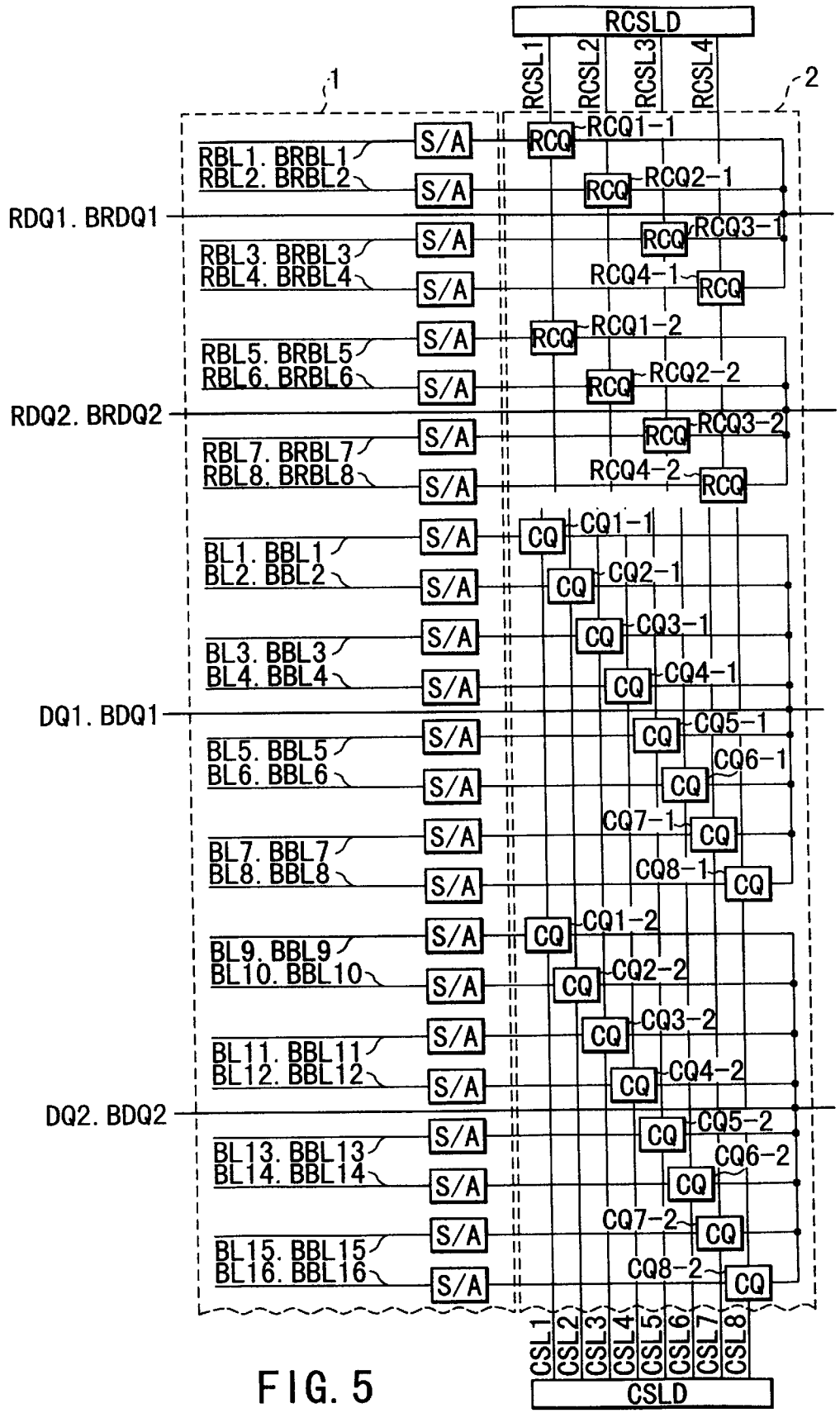
FIG. 5 is a block diagram of a memory cell array/sense amplifier region and column selector region.

FIG. 5 is a block diagram showing a block example of the memory cell/sense amplifier region 1 and column selector region 2. FIG. 5 shows two pairs of data lines DQ1 and BDQ1, and DQ2 and BDQ2 of the 128 data line pairs.

As shown in FIG. 5, the pair of data lines DQ1 and BDQ1 are commonly connected to eight pairs of bit lines BL1 and BBL1 to BL8 to BBL8 via column selection transistors CQ1-1 to CQ8-1. Likewise, the pair of data lines DQ2 and BDQ2 are commonly connected to eight pairs of bit lines BL9 and BBL9 to BL16 and BBL16 via column selection transistors CQ1-2 to CQ8-2.

The gates of the column selection transistors CQ1-1 and CQ1-2 are commonly connected to a column selection line CSL1, the gates of the column selection transistors CQ2-1 and CQ2-2 to a column selection line CSL2, . . . , and the gates of the column selection transistors CQ8-1 and CQ8-2 to a column selection line CSL8. These column selection transistors CQ1-1 to CQ8-1 and CQ1-2 to CQ8-2 are turned on/off in correspondence with the potentials on the column selection lines CSL1 to CSL8. In this way, the pair of data lines DQ and BDQ are connected to one of the eight pairs of bit lines BL and BBL.

The pairs of bit lines BL and BBL extend to a memory cell array via a sense amplifier S/A.

Figure 6:
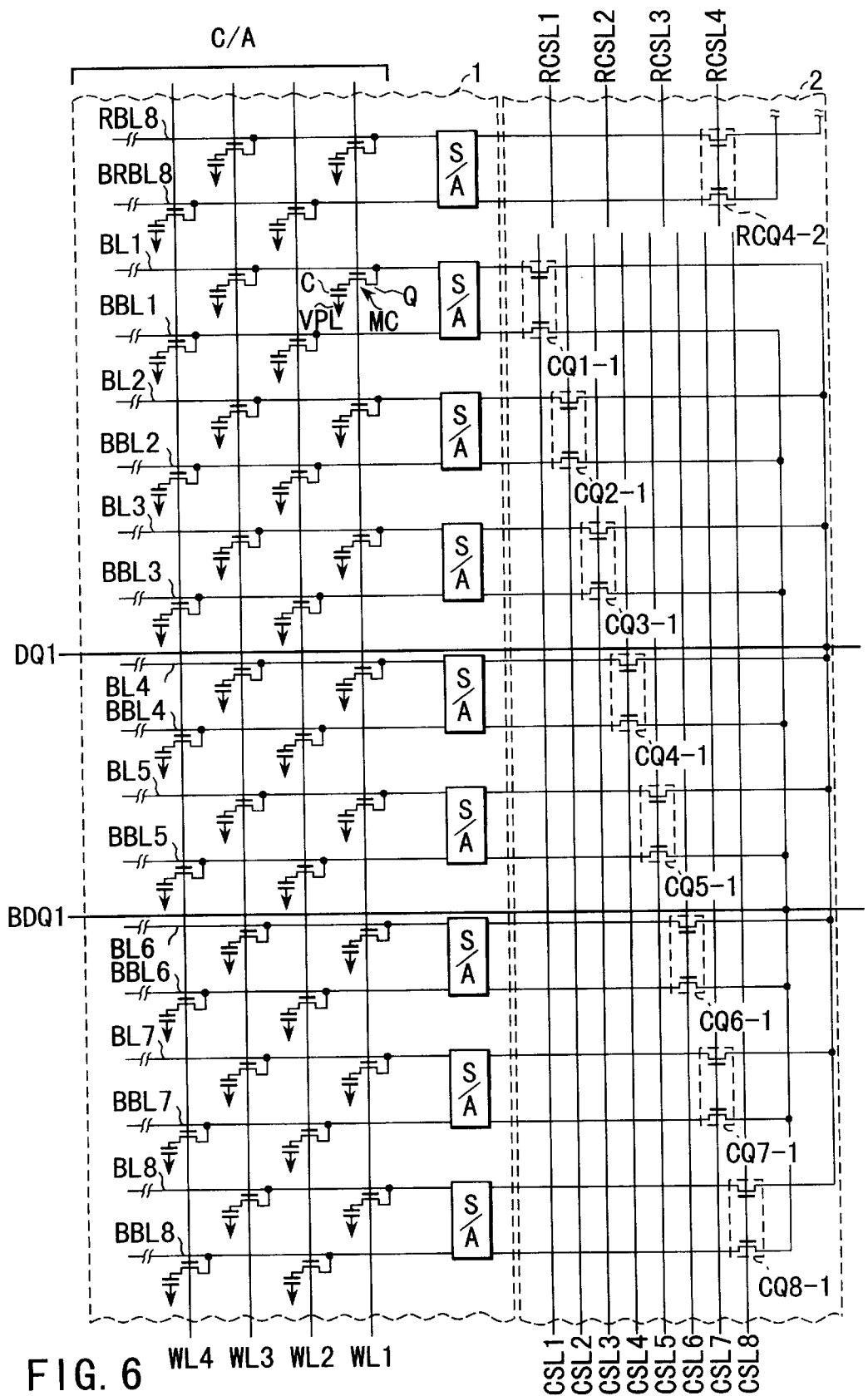
FIG. 6 is a circuit diagram of a memory cell array/sense amplifier region and column selector region.

FIG. 6 is a circuit diagram showing a circuit example of the memory cell array/sense amplifier region 1 and column selector region 2. FIG. 6 illustrates the pair of data lines DQ1 and BDQ1, and pairs of bit lines BL1 and BBL1 to BL8 and BBL8. The pairs of bit lines BL1 and BBL1 to BL8 and BBL8 use a folded bit line scheme.

As shown in FIG. 6, a plurality of memory cells MC are laid out in a matrix in the memory cell array C/A. Each of the plurality of memory cells MC is constructed by a transfer transistor Q and capacitor C. One electrode of the capacitor C is connected to the source of the transfer transistor Q. The other electrode receives a plate potential VPL. The capacitor C stores data by accumulating it as a charge. The drain of the transfer transistor Q is connected to one of the bit lines BL and BBL, and its gate is connected to a word line WL (WL1 to WL4 in FIG. 6). The word line WL intersects the pairs of bit lines BL and BBL. The transfer transistor Q is turned on in correspondence with the potential on the word line WL. In this way, all the transfer transistors Q connected to one word line WL are turned on, and the capacitors C and the bit lines BL or BBL are connected to each other.

Upon read, the potential on the bit line BL or BBL infinitesimally changes in correspondence with the charge accumulated on the capacitor C. The sense amplifier S/A amplifies that infinitesimal change. When one of the column selection lines CSL1 to CSL8 changes to "H" level, one of the eight pairs of bit lines BL1 and BBL1 to BL8 and BBL8 to which readout data have been respectively transmitted are connected to the pair of data lines DQ1 and BDQ1.

Upon write, when one of the column selection lines CSL1 to CSL8 changes to "H" level, the data lines DQ1 and BDQ1 to which data to be written have been transmitted are connected to one of the eight pairs of bit lines BL1 and BBL1 to BL8 and BBL8.

The column selection lines CSL1 to CSL8 that selectively connect the pair of data lines DQ and BDQ and the selected one of the eight pairs of bit lines BL and BBL are respectively connected to a column selection line driver 11. The column selection line driver 11 sets one of the column selection lines CSL1 to CSL8 at "H" level in accordance with column address bits AC0 to AC2.

Figure 7:
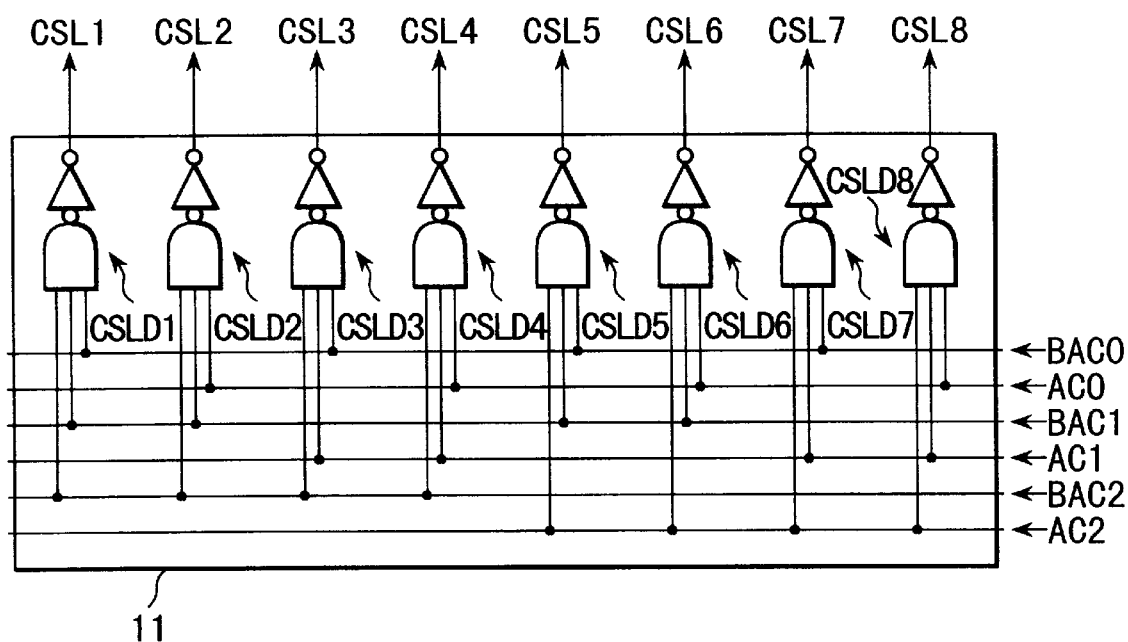
FIG. 7 is a circuit diagram of a column selection line driver.

FIG. 7 is a circuit diagram showing a circuit example of the column selection line driver 11.

As shown in FIG. 7, the column selection line driver 11 has eight column selection line drive circuits CSLD1 to CSLD8. The output of the drive circuit CSLD1 is connected to the column selection line CSL1, . . . , and the output of the drive circuit CSLD8 to the column selection line CSL8. The drive circuit CSLD1 receives column address bits BAC0, BAC1 and BAC2, . . . , and the drive circuit CSLD8 receives column address bits AC0, AC1 and AC2. Each of the drive circuits CSLD1 to CSLD8 shown in this circuit example is comprised of an AND gate. Hence, only when all the inputs of the AND gate go "H", each drive circuit sets its output at "H".

In the first embodiment, the DRAM has two pairs of redundant data lines RDQ1 and BRDQ1, and RDQ2 and BRDQ2, in addition to the pairs of data lines DQ1 and BDQ1 to DQ128 and BDQ128 that form the regular data line pairs. The pairs of redundant data lines RDQ1 and BRDQ1, and RDQ2 and BRDQ2, are auxiliary data line pairs which replace a regular data line pair when memory cells connected to the regular data line pair are failed.

The pair of redundant data lines RDQ1 and BRDQ1 are connected to a redundant data line buffer RDQB1, and the pairs of redundant data lines RDQ2 and BRDQ2 are connected to a redundant data line buffer RDQB2.

The redundant data line buffer RDQB1 is connected to a redundant read data line RRD1 and redundant write data line RWD1, and the redundant data line buffer RDQB2 is connected to a redundant read data line RRD2 and redundant write data line RWD2.

The circuit arrangement of the redundant data line buffers RDQB1 and RDQB2 is the same as the data line buffers DQB shown in FIG. 4.

The redundant read data lines RRD1 and RRD2, and redundant write data lines RWD1 and RWD2, are connected to the RD/WD multiplexer 10.

The RD/WD multiplexer 10 multiplexes the read data lines RD1 to RD128 and the redundant read data lines RRD1 and RRD2, and multiplexes the write data lines WD1 to WD128 and the redundant write data lines RWD1 and RWD2.

Figure 8:
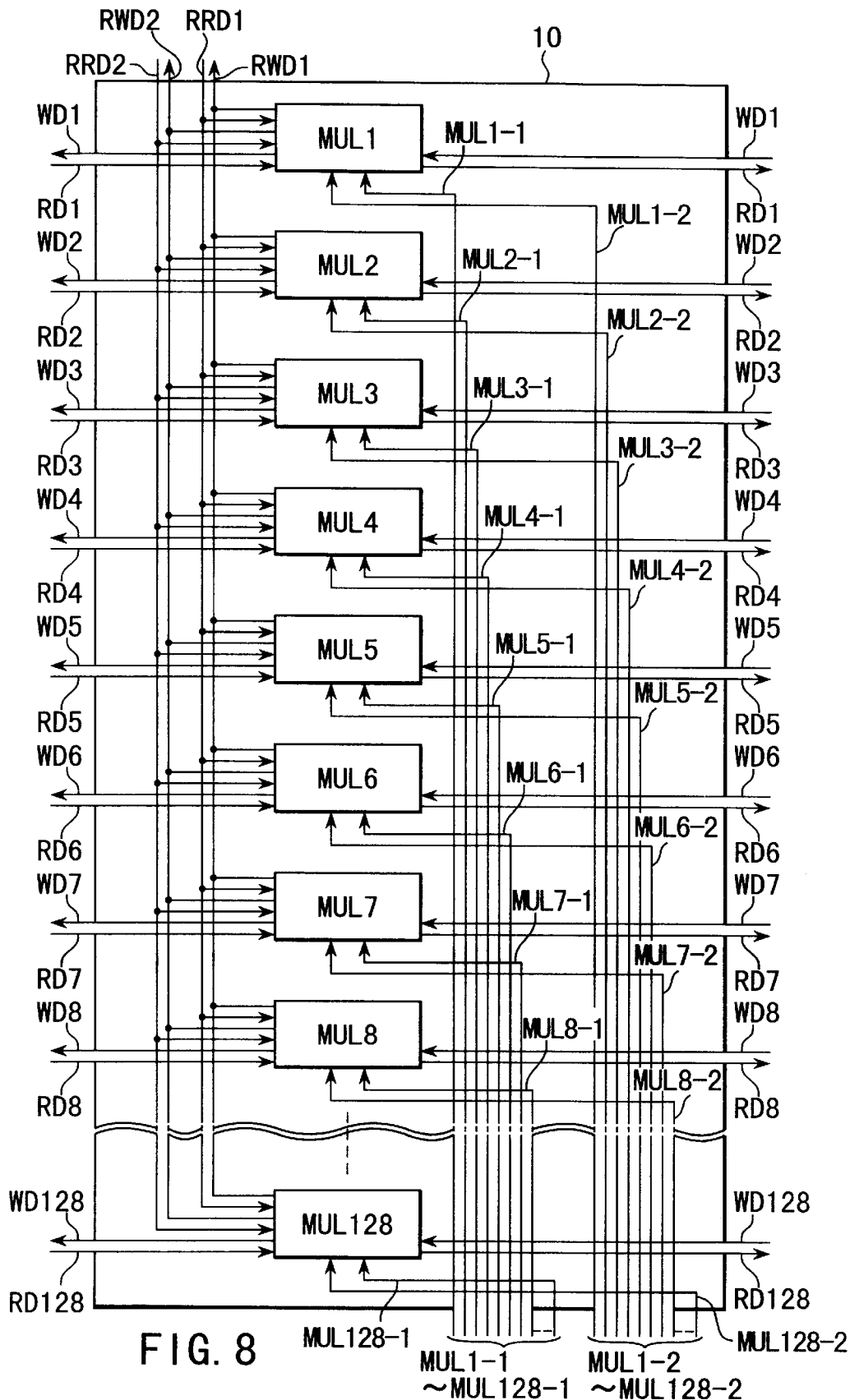
FIG. 8 is a block diagram of an RD/WD multiplexer.

FIG. 8 is a block diagram of the RD/WD multiplexer 10.

As shown in FIG. 8, the RD/WD multiplexer 10 has 128 multiplex circuits MUL1 to MUL128. The read data line RD1 and write data line WD1 is connected to the multiplex circuit MUL1, . . . , and the read data line RD128 and write data line WD128 to the multiplex circuit MUL128. The redundant read data line RRD1 and redundant write data line RWD1 are connected to all the multiplex circuits MUL1 to MUL128. In an analogous manner, the redundant read data line RRD2 and redundant write data line RWD2 are connected to all the multiplex circuits MUL1 to MUL128.

The multiplex circuit MUL1 multiplexes a selected one of the read data line RD1 and redundant read data lines RRD1 and RRD2 to one read data line RD1. Also, the multiplex circuit MUL1 multiplexes one write data line WD1 to a selected one of the write data line WD1 and redundant write data lines RWD1 and RWD2.

The same applies to other multiplex circuits MUL2 to MUL128. For example, the multiplex circuit MUL128 multiplexes a selected one of the read data line RD128 and redundant read data lines RRD1 and RRD2 to one read data line RD128. Also, the multiplex circuit MUL128 demultiplexes one write data line WD128 to a selected one of the write data line WD128 and redundant write data lines RWD1 and RWD2. These selections are made in accordance with selection signals MUL1-1 to MUL128-1 and MUL1-2 to MUL128-2.

Figure 9:
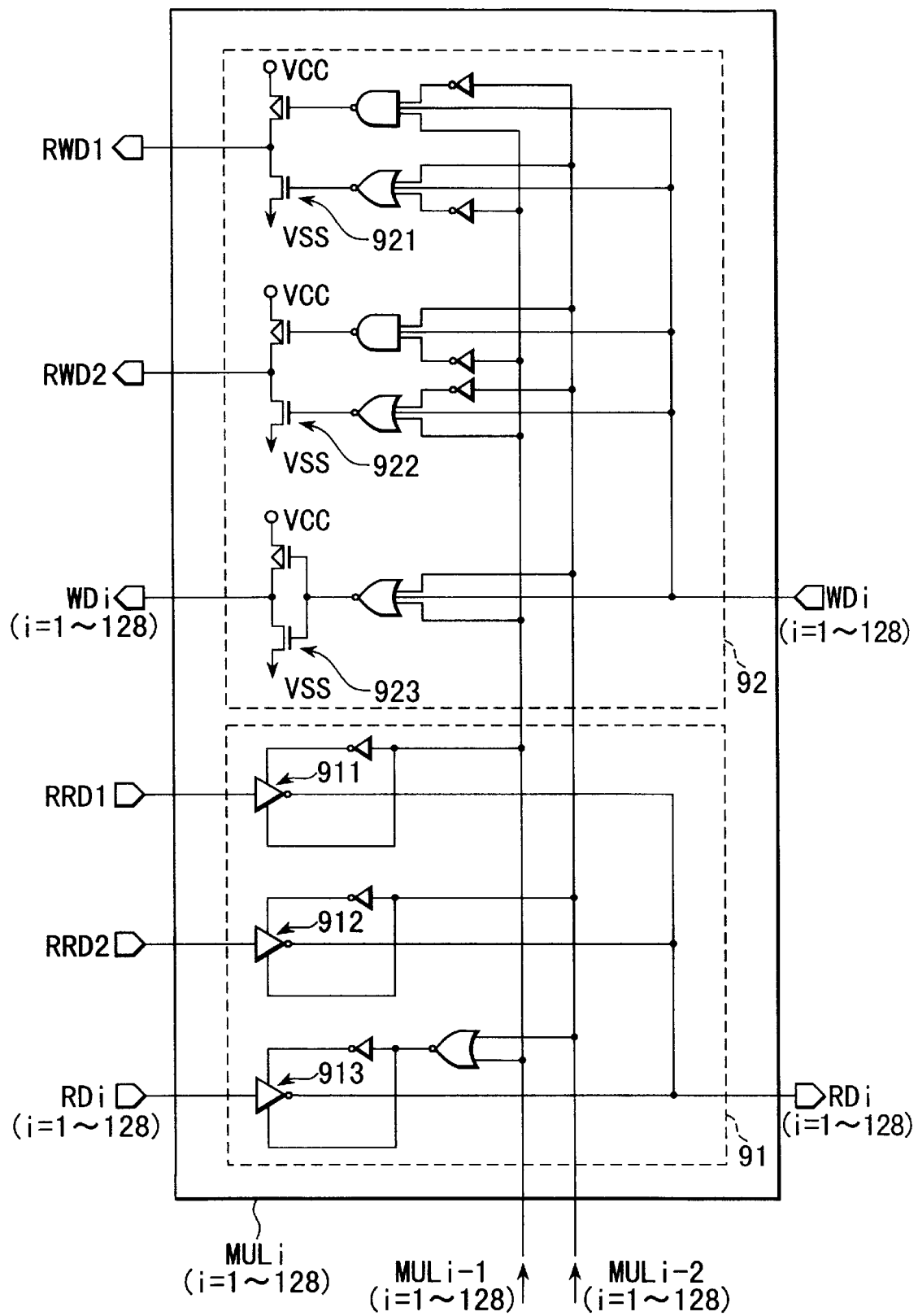
FIG. 9 is a circuit diagram of a multiplex circuit.

FIG. 9 is a circuit diagram showing a circuit example of the multiplex circuit MUL.

As shown in FIG. 9, the multiplex circuit MUL includes a read data line multiplex circuit 91 and write data line demultiplex circuit 92.

The read data line multiplex circuit 91 includes clocked inverters 911, 912, and 913, and the clocked inverter 911 is enabled only when a selection signal MULi-1 is at "H" level. The clocked inverter 92 is enabled only when a selection signal MULi-2 is at "H" level. The clocked inverter 913 is enabled only when both the selection signals MULi-1 and MULi-2 are at "L" level. In this fashion, the output from one of the redundant data line buffers RDQB1 and RDQB2 and data line buffer DQB is electrically connected to one read data line RD.

The write data line demultiplex circuit 92 includes output buffer circuits 921, 922, and 923. The output buffer circuit 921 is enabled only when a selection signal MULi-1 is at "H" level. The output buffer circuit 922 is enabled only when a selection signal MULi-2 is at "H" level. The output buffer circuit 923 is enabled only when both the selection signals MULi-1 and MULi-2 are at "L" level. Consequently, the write data line WD is electrically connected to the input of one of the redundant data line buffers RDQB1 and RDQB2 and data line buffer DQB.

The pairs of redundant data lines RDQ1 and BRDQ1, and RDQ2 and BRDQ2, run above the memory cell/sense amplifier region 1 and column selector region 2 in the same manner as the pairs of data lines DQ1 and BDQ1 to DQ128 and BDQ128.

FIG. 5 shows the pairs of redundant data lines RDQ1 and BRDQ1, and RDQ2 and BRDQ2.

As shown in FIG. 5, the pair of redundant data lines RDQ1 and BRDQ1 are commonly connected to four pairs of redundant bit lines RBL1 and BRBL1 to RBL4 and BRBL4 via redundant column selection transistors RCQ1-1 to RCQ4-1. Similarly, the pair of redundant data lines RDQ2 and BRDQ2 are commonly connected to four pairs of redundant bit lines RBL5 and BRBL5 to RBL8 and BRBL8 via redundant column selection transistors RCQ1-2 to RCQ4-2.

The gates of the redundant column selection transistors RCQ1-1 and RCQ1-2 are commonly connected to a redundant column selection line RCSL1, the gates of the redundant selection transistors RCQ2-1 and RCQ2-2 to a redundant column selection line RCSL2, . . . , and the gates of the redundant column selection transistors RCQ4-1 and RCQ4-2 to a redundant column selection line RCSL4. These redundant column selection transistors RCQ1-1 to RCQ4-1, and RCQ1-2 to RCQ4-2 are turned on/off in correspondence with the potentials on the redundant column selection lines RCSL1 to RCSL4. Hence, the pair of redundant data line RDQ and BRDQ is connected to one of the four pairs of redundant bit lines RBL and BRBL.

The pairs of redundant bit lines RBL and BRBL, and the pair of bit lines BL and BBL, extend to the memory cell array via the sense amplifier S/A.

Figure 10:
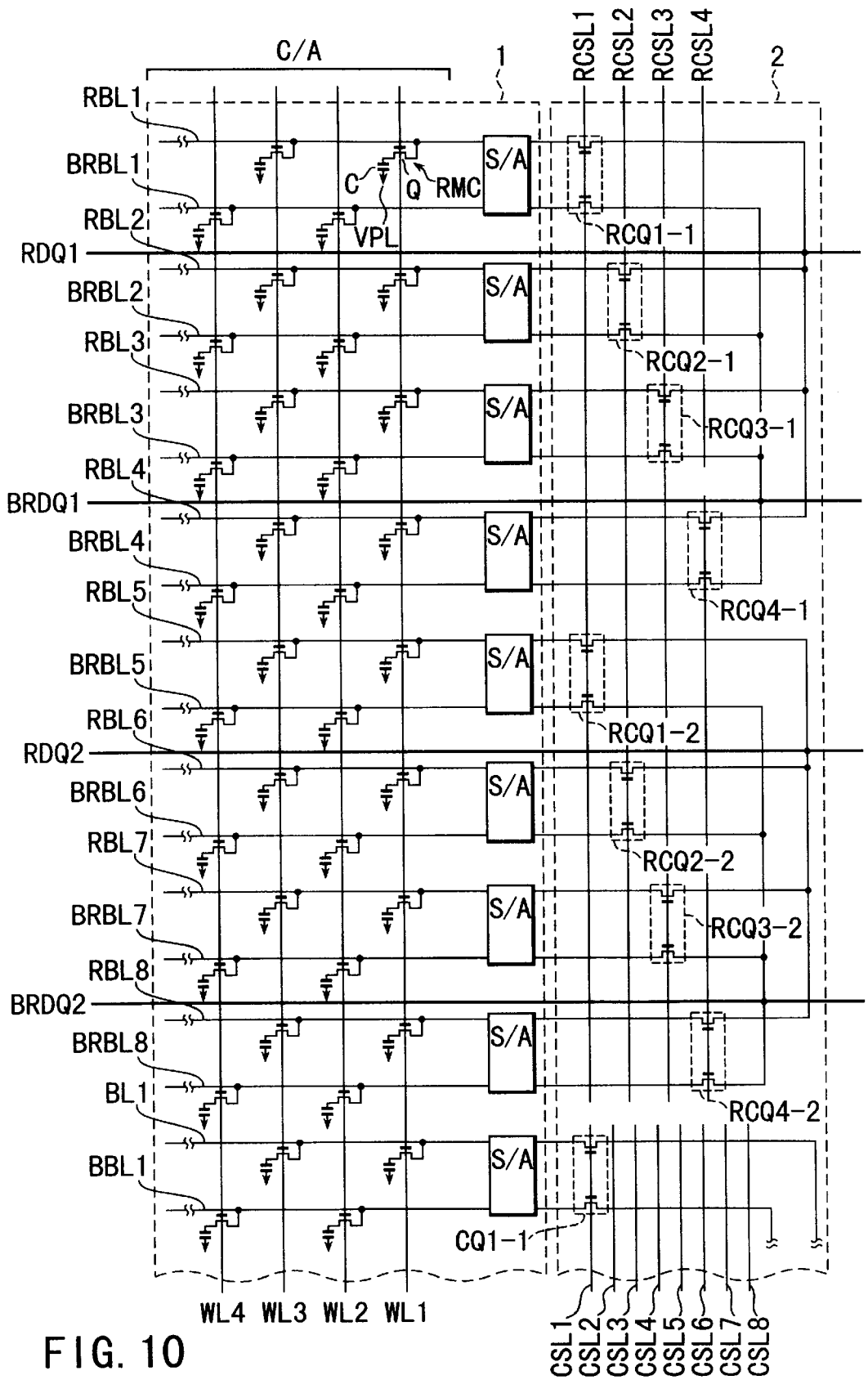
FIG. 10 is a circuit diagram of a memory cell array/sense amplifier region and column selector region.

FIG. 10 is a circuit diagram showing a circuit example of the memory cell array/sense amplifier region 1 and column selector region 2. FIG. 10 especially shows a portion where redundant memory cells are laid out.

As shown in FIG. 10, a plurality of redundant memory cells RMC are laid out in a matrix in the memory cell array C/A. Each of the plurality of redundant memory cells RMC is comprised of a transfer transistor Q and capacitor C, as in the memory cell MC shown in FIG. 6. One electrode of the capacitor C is connected to the source of the transfer transistor Q. The other electrode receives the plate potential VPL. The capacitor C stores data by accumulating it as a charge. The drain of the transfer transistor Q is connected to one of the redundant bit lines RBL and BRBL, and its gate is connected to a word line (WL1 to WL4 in FIG. 10). The word line WL intersects the pairs of redundant bit lines RBL and BRBL. The word lines WL are common to the regular memory cells shown in FIG. 6. The transfer transistor Q is turned on/off in correspondence with the potential on the word line WL. In this manner, all the transfer transistors Q connected to one word line WL are turned on, and the capacitors C and the redundant bit lines RBL or BRBL are connected to each other.

Upon read, the potential on the redundant bit line RBL or BRBL infinitesimally changes in correspondence with the charge accumulated on the capacitor C. The sense amplifier S/A amplifies that infinitesimal change. When one of the redundant column selection lines RCSL1 to RCSL4 changes to "H" level, one of the four pairs of redundant bit lines RBL and BRBL to which readout data have been respectively transmitted are connected to the pair of redundant data lines RDQ and BRDQ.

Upon write, when one of the redundant column selection lines RCSL1 to RCSL4 changes to "H" level, the pair of redundant data lines RDQ and BRDQ to which data to be written have been transmitted are connected to one of the four pairs of redundant bit lines RBL and BRBL.

The redundant column selection lines RCSL1 to RCSL4 are respectively connected to a redundant column selection line driver 13. The redundant column selection line driver 13 sets one of the redundant column selection lines RCSL1 to RCSL4 at "H" level in accordance with column address bits AC1 and AC2.

Figure 11:
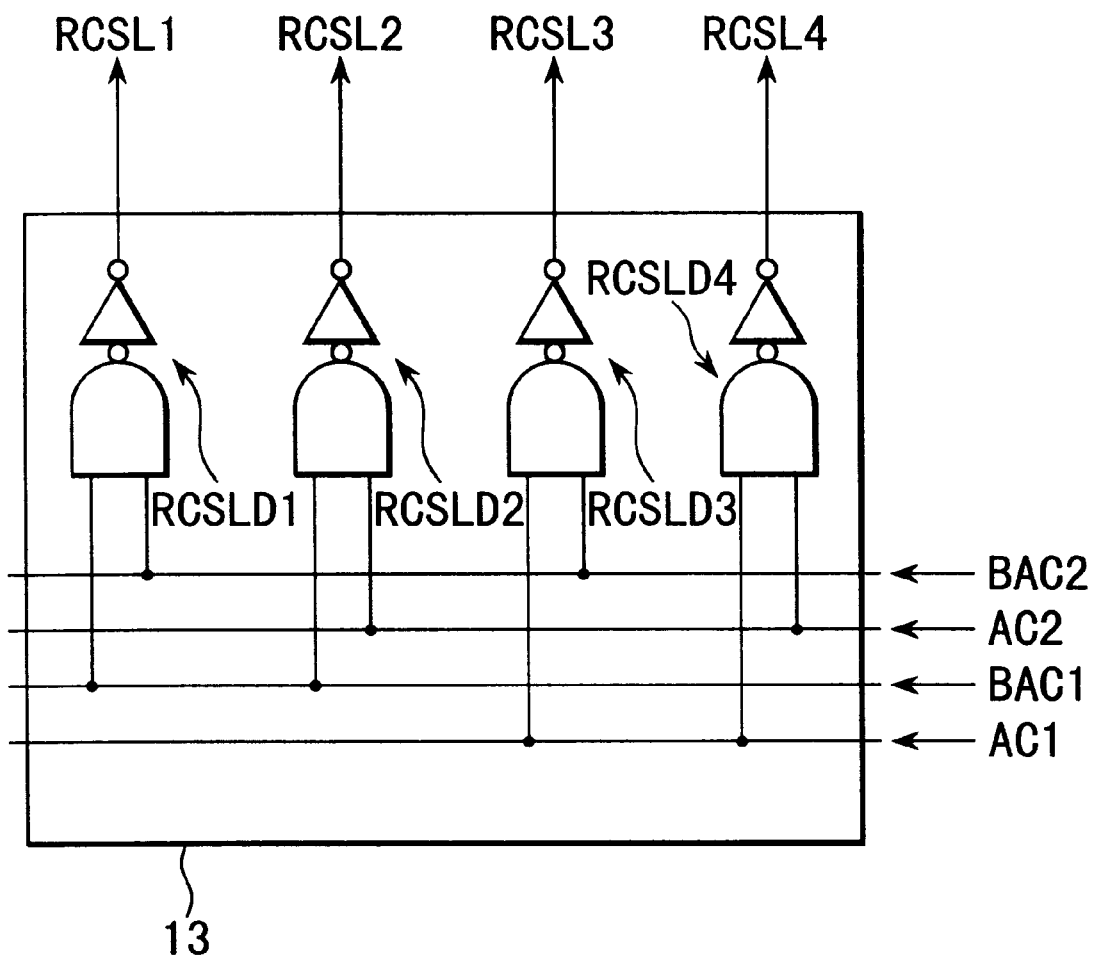
FIG. 11 is a circuit diagram of a redundant column selection line driver.

FIG. 11 is a circuit diagram showing a circuit example of the redundant column selection line driver 13.

As shown in FIG. 11, the redundant column selection line driver 13 has four redundant column selection line drive circuits RCSLD1 to RCSLD4. The output of the drive circuit RCSLD1 is connected to the redundant column selection line RCSL1, . . . , and the output of the drive circuit RCSLD4 to the redundant column selection line RCSL4. The drive circuit RCSLD1 receives column address bits BAC1 and BAC2, . . . , and the drive circuit RCSLD4 receives column address bits AC1 and AC2. Each of the drive circuits RCSLD1 to RCSLD4 shown in this circuit example is constituted by an AND gate. Hence only when all the inputs of the AND gate go "H", the drive circuit sets its output at "H".

The selection signals MUL1-1 to MUL128-1, and MUL1-2 to MUL128-2, are output from the replace control circuit (FUSE & LOGIC) 12.

Figure 12:
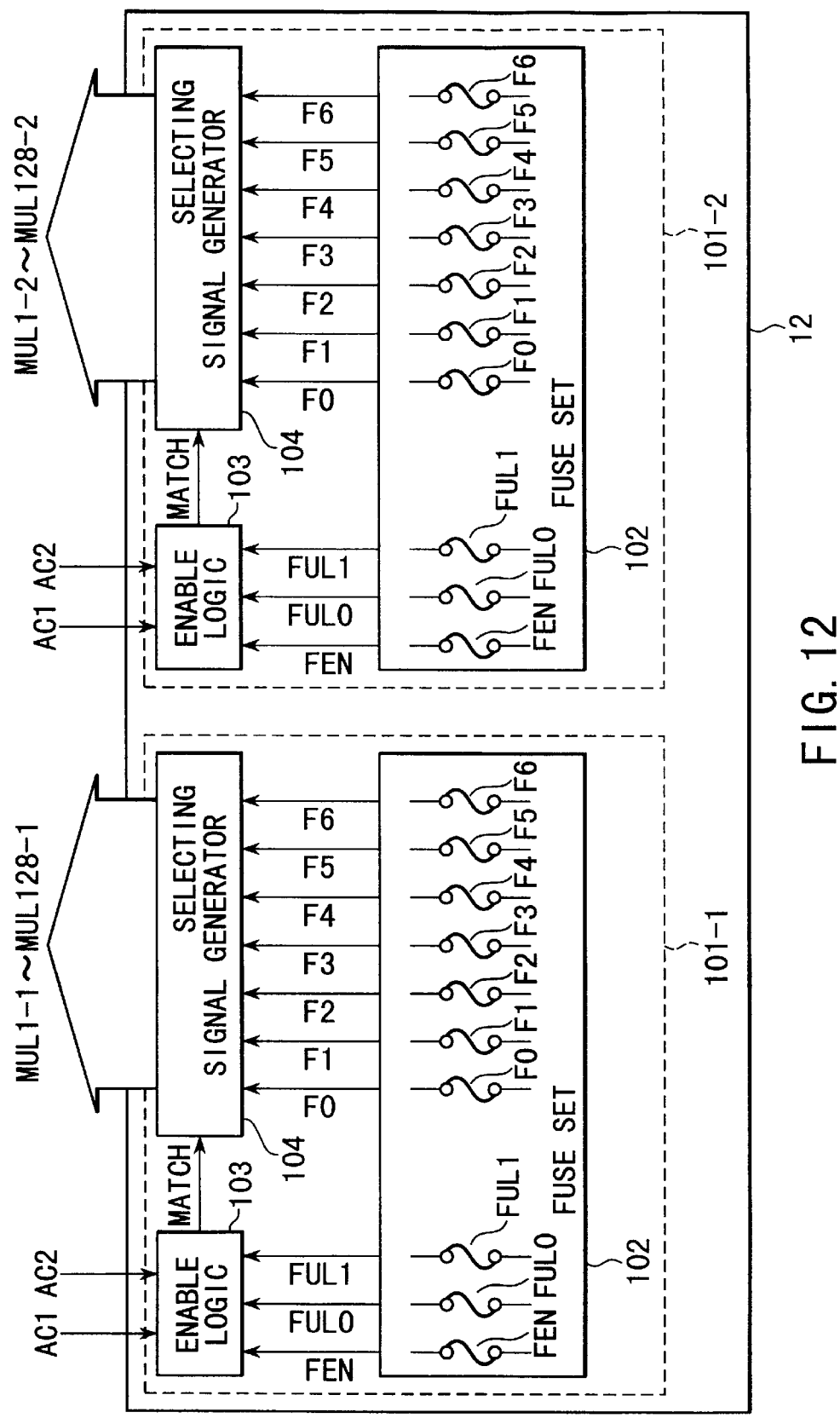
FIG. 12 is a block diagram of a replace control circuit.

FIG. 12 is a block diagram of the replace control circuit 12.

As shown in FIG. 12, the replace control circuit 12 includes selection circuits 101-1 and 101-2. The selection circuit 101-1 outputs the selection signals MUL1-1 to MUL128-1. The selection signals MUL1-1 to MUL128-1 are those for selecting the pair of redundant data lines RDQ1 and BRDQ1 in place of a regular data line pair. Similarly, the selection circuit 101-2 outputs the selection signals MUL1-2 to MUL128-2 to select the pair of redundant data lines RDQ2 and BRDQ2 in place of a regular data line pair. These selection circuits 101-1 and 101-2 are provided in units of redundant data line pairs. In the first embodiment, since there are two redundant data line pairs, two selection circuits 101-1 and 101-2 are used.

The selection circuits 101-1 and 101-2 have the same block arrangement, and each includes a fuse set circuit 102, enable logic circuit 103, and selection signal generator 104.

The fuse set circuit 102 has 10 fuses FEN, F0 to F6, FUL0, and FUL1. The fuse FEN is programmed with information indicating whether or not a redundant data line pair are used. Each of the fuses F0 to F6 is programmed with information of one to be replaced of the 128 data line pairs. Each of the fuses FUL0 and FUL1 is programmed with the column address information (replace column address information) of the one to be replaced of the plurality of pairs (eight pairs in the first embodiment) of regular bit lines connected to a regular data line pair. These 10 fuses store information depending on whether or not they are disconnected. If the fuse is disconnected, the potential at its output terminal side is "H" level; otherwise, the potential at its output terminal side is "L" level.

The enable logic circuit 103 receives the column address bits AC1 and AC2, the output from the fuse FEN, and the outputs from the fuses FUL0 and FUL1. The column address bits AC1 and AC2 correspond to the second and third bits from the least significant bit of a column address.

Figures 13, 14:
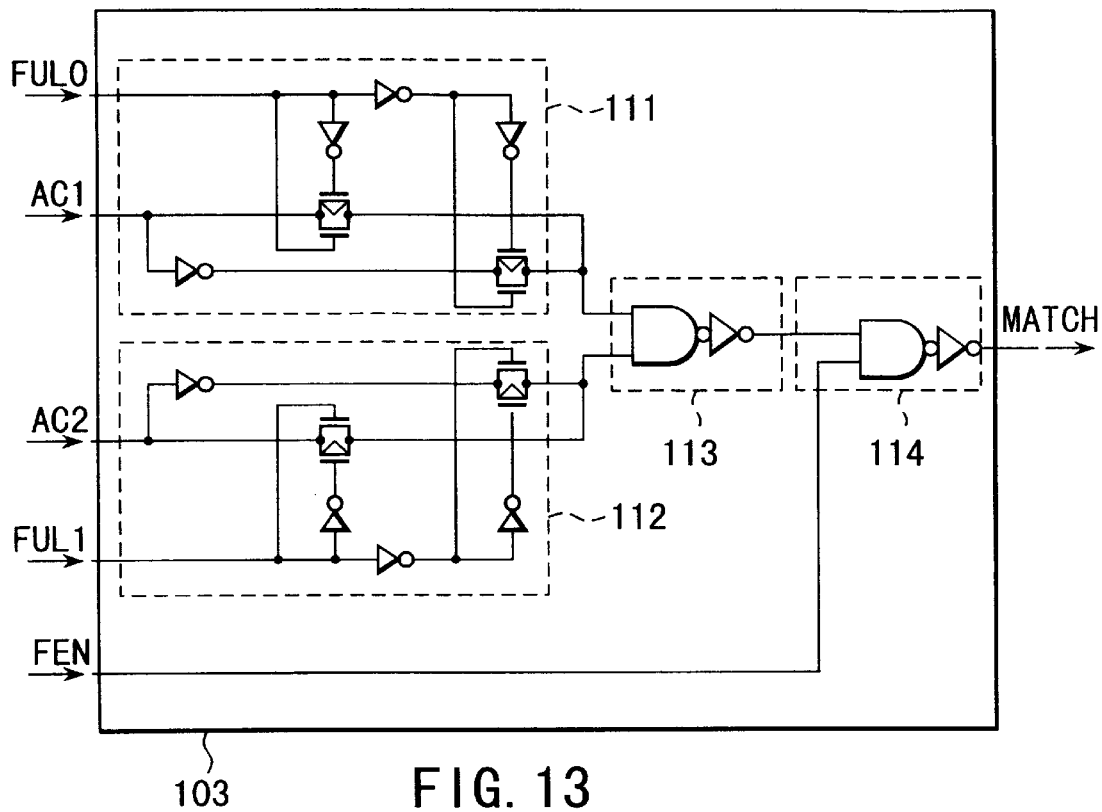
FIG. 13 is a circuit diagram of an enable logic circuit.
FIG. 14 is a table showing the relationship between the column address and column selection line.

FIG. 13 is a circuit diagram showing a circuit example of the enable logic circuit 103.

As shown in FIG. 13, the enable logic circuit 103 includes matching/mismatching detection circuits 111, 112, 113, and 114.

The matching/mismatching detection circuit 111 sets its output at "H" level when the output level of the fuse FUL0 matches the level of the column address bit AC1. The matching/mismatching detection circuit 112 sets its output at "H" level when the output level of the fuse FUL1 matches the level of the column address bit AC2. The matching/mismatching detection circuit 113 sets its output at "H" level when the output levels of both the detection circuits 111 and 112 are "H" level. The matching/mismatching detection circuit 114 sets its output, i.e., a signal MATCH, at "H" level when the output level of the fuse FEN and the output level of the detection circuit 113 are both "H".

In this fashion, the enable logic circuit 103 detects if the column address bits AC1 and AC2 match the output levels of the fuses FUL0 and FUL1, i.e., replace column address information. The replace column address information indicates the column address bits AC1 and AC2 of the column address bits AC0 to AC2. FIG. 14 shows the relationship between the column address bits AC0 to AC2, and the column selection line selected.

Figures 15, 16, 17:
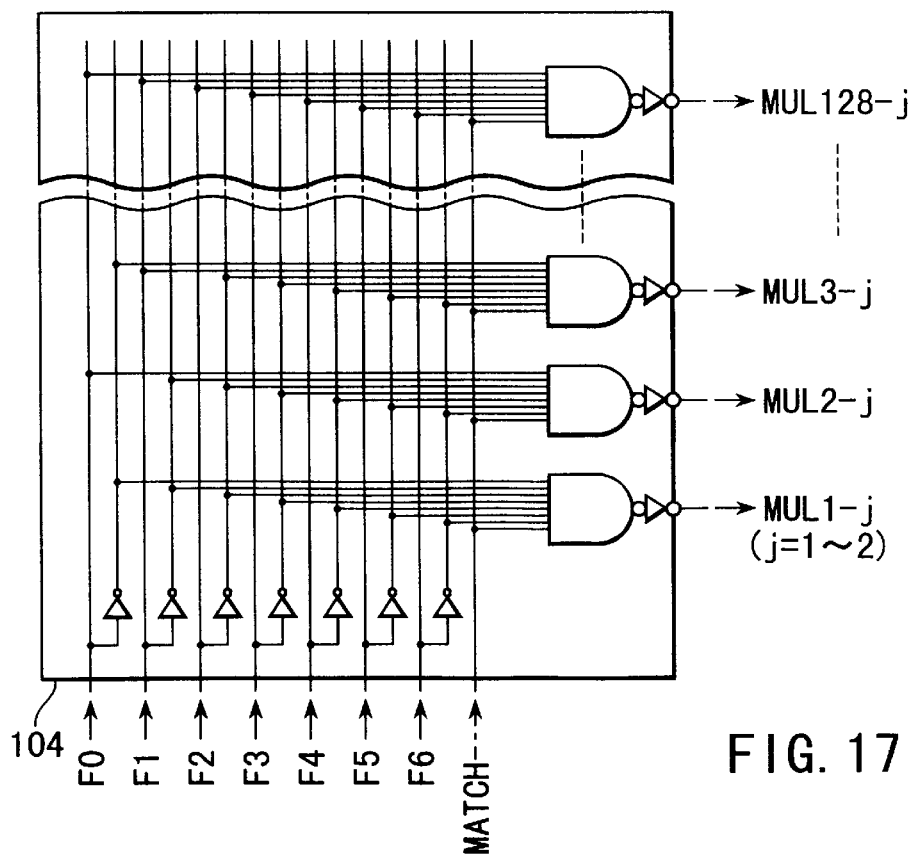
FIG. 15 is a table showing the relationship between the replacing column address information and column selection line.
FIG. 16 is a table showing the relationship between the column address and redundant column selection line.
FIG. 17 is a circuit diagram of a selection signal generation circuit.

As shown in FIG. 14, the column selection line for selecting the regular bit line pair to be replaced can be specified by detecting whether or not the column address bits AC1 and AC2 match the replace column address information. FIG. 15 shows the relationship between the replace column address information and the corresponding column selection line.

As shown in FIG. 15, when both the outputs from the fuses FUL0 and FUL1 are at "L" level, it indicates that one of bit line pairs selected by the column selection lines CSL1 and CSL2 are to be replaced. Also, when both the fuses FUL0 and FUL1 are at "L" level, both the column address bits AC1 and AC2 are also at "L" level. FIG. 16 shows the relationship between the column address bits AC1 and AC2 and the redundant column selection line to be selected.

As shown in FIG. 16, when both the column address bits AC1 and AC2 are at "L" level, the redundant column selection line RCSL1 is selected. As a result, the pair of redundant data lines RDQ1 and BRDQ1 are electrically connected to the pair of redundant bit lines RBL1 and BRBL1, and the pair of redundant data lines RDQ2 and BRDQ2 to the pair of redundant bit lines RBL5 and BRBL5.

Furthermore, the enable logic circuit 103 refers to information programmed in the fuse FEN. That is, when the replace column address information and bits AC1 and AC2 of the column address match, and when the output from the fuse FEN is at "H" level, i.e., the fuse FEN is disconnected, the circuit 103 sets the signal MATCH at "H" level. This signal MATCH determines if the selection signal generator 104 to be described below is to be enabled. If the signal MATCH is "H" level, the selection signal generator 104 is enabled.

FIG. 17 is a circuit diagram showing a circuit example of the selection signal generator 104.

As shown in FIG. 17, the selection signal generator 104 uses a normal decode circuit comprised of AND gates as in the column selection line drive circuit CSLD. The selection signal generator 104 decodes a combination of the output levels of the fuses F0 to F6. If the signal MATCH is at "H" level, the generator 104 sets one of selection signals MUL1 to MUL128 at "H" level in accordance with the output levels of the fuses F0 to F6.

The replace operation done by the replace control circuit 12 will be explained below.

Figure 18:
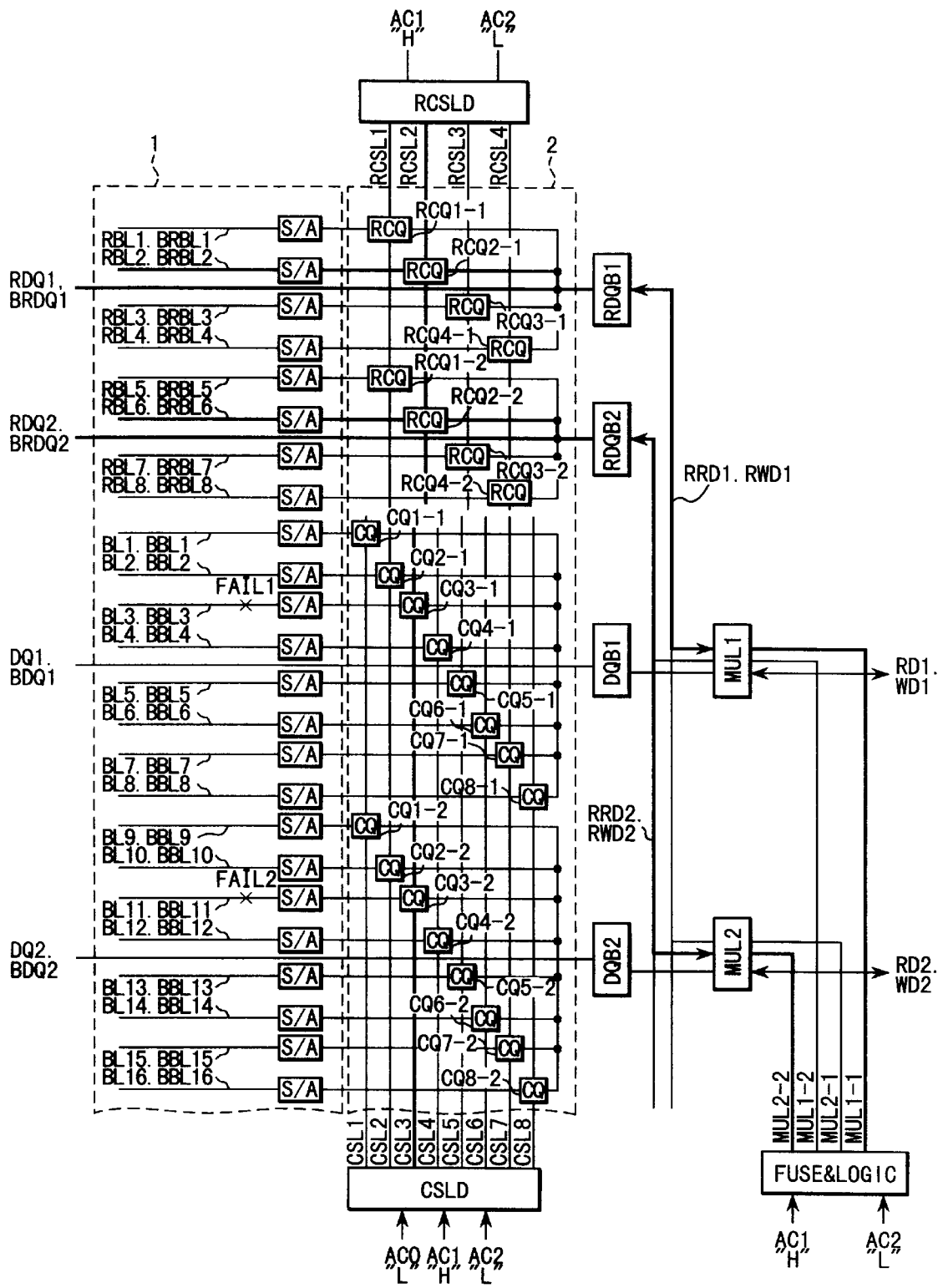
FIG. 18 is a diagram showing the replace operation of the first embodiment of the present invention.

FIG. 18 is a diagram showing the replace operation of the first embodiment of the present invention.

As shown in FIG. 18, a failed memory cell (FAIL1) is present on the pair of bit lines BL3 and BBL3, and another failed memory cell (FAIL2) is present on the pair of bit lines BL11 and BBL11. Both the pairs of bit lines BL3 and BBL3, and BL11 and BBL11, are selected by the column selection line CSL3.

In this case, information which sets FEN at "H", FUL0 at "H", FUL1 at "L", and selection signal MUL1-1 at "H" is programmed in the fuse set circuit 102 of the selection circuit 101-1 to rescue the pair of bit lines BL3 and BBL3.

Similarly, information which sets FEN at "H", FUL0 at "H", FUL1 at "L", and selection signal MUL2-2 at "H" is programmed in the fuse set circuit 102 of the selection circuit 101-2 to rescue the pair of bit lines BL11 and BBL11.

When the column address bits AC0, AC1, and AC2 respectively go "L", "H", and "L", the column selection line driver CSLD sets the column selection line CSL3 at "H" and the redundant column selection line driver RCSLD sets the redundant column selection line RCSL2 at "H". Since signals MATCH go "H" in the enable logic circuits 103 of the selection circuits 101-1 and 101-2, the replace control circuit 12 sets the selection signal MUL1-1 at "H" and MUL2-2 at "H". Since the selection signals MUL1-1 and MUL2-2 respectively go "H", the read data line RD1 and write data line WD1 are electrically connected to the redundant data line buffer RDQB1, and the read data line RD2 and write data line WD2 to the redundant data line buffer RDQB2.

In this fashion, the bit lines BL3 and BBL3 are replaced by the redundant but lines RBL2 and BRBL2, and the bit lines BL11 and BBL11 by the redundant bit lines RBL6 and BRBL6.

When the column address bits AC0 to AC2 have a combination other than that described above, since both the selection signals MUL1-1 and MUL2-2 go "L", the read data line RD1 and write data line WD1 are electrically connected to the data line buffer DQB1, and the read data line RD2 and write data line WD2 to the data line buffer DQB2.

The effects of the present invention will be explained below in comparison to the DRAM shown in FIG. 2.

Figure 1:
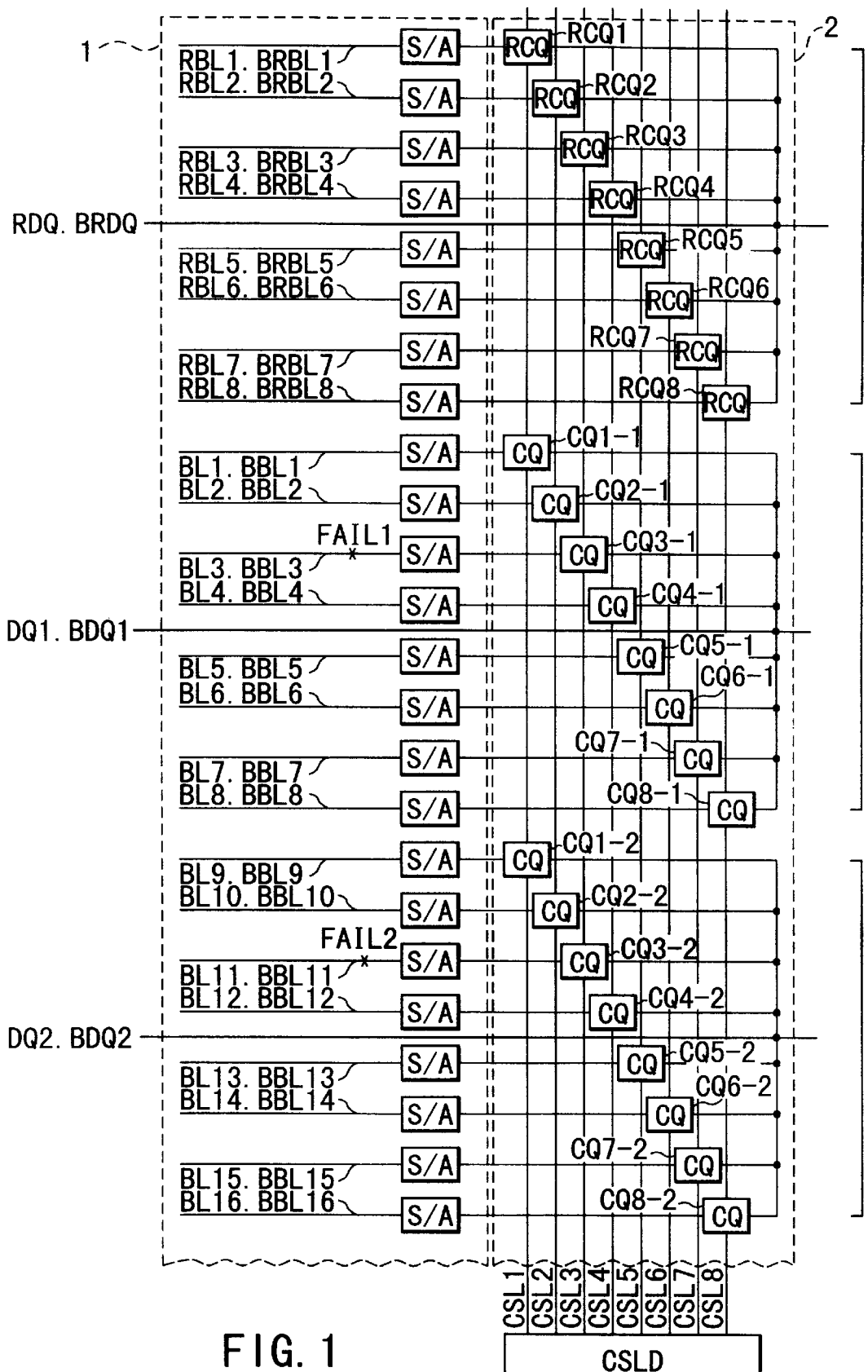
FIG. 1 is a block diagram of a conventional DRAM.
Figure 2:
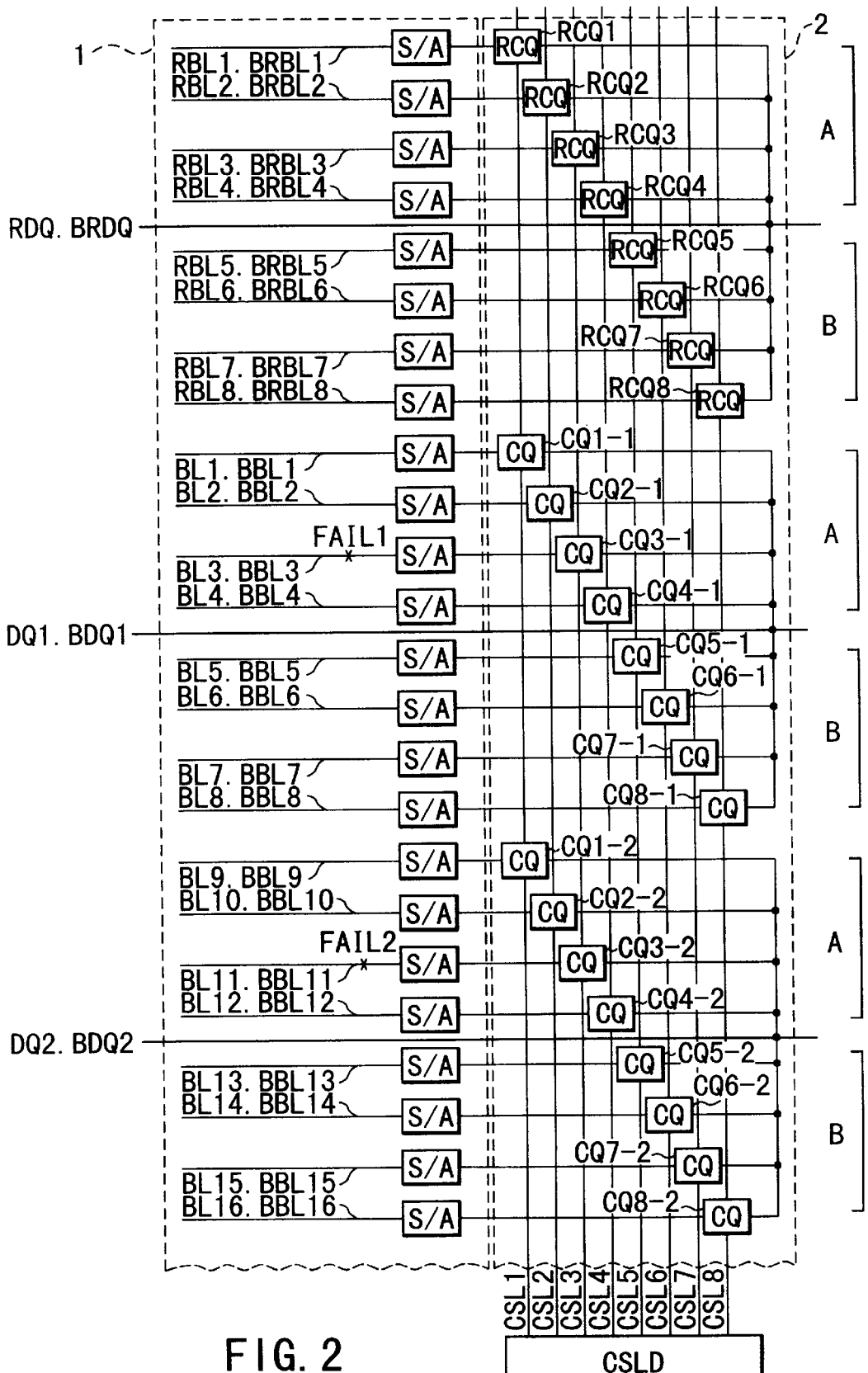
FIG. 2 is a block diagram of an improved DRAM.

In the DRAM shown in FIG. 2, it is impossible to simultaneously rescue the pairs of bit lines BL3 and BBL3, and BL11 and BBL11, since the column selection line CSL3 is common to the regular bit line pairs and redundant bit line pairs.

By contrast, the DRAM according to the first embodiment has two redundant data line pairs, as shown in FIG. 18. For this reason, the pairs of bit lines BL3 and BBL3, and BL11 and BBL11, can be simultaneously rescued. In this way, the DRAM according to the first embodiment can reduce unrescuable cases, and can improve the rescue efficiency, as compared to the DRAM shown in FIG. 2.

In addition, the DRAM according to the first embodiment has the redundant column selection lines RCSL independently of the column selection lines CSL. The number of redundant column selection lines RCSL is set to be smaller than that of the column selection lines CSL. With this arrangement, even when the number of redundant data line pairs is increased, the number of redundant bit line pairs need not be increased. Hence, the area of the memory cell array C/A can be prevented from increasing.

In the DRAM according to the first embodiment, the memory cell array/sense amplifier region 1 is laid out between the redundant column selection line drivers RCSLD and column selection line drivers CSLD. The redundant bit line pairs are laid out near the redundant column selection line drivers RCSLD side in the memory cell/sense amplifier region 1, and the regular bit line pairs are laid out near the column selection line drivers CSLD side. With this arrangement, both the redundant column selection lines RCSL and column selection lines CSL can be shortened, thus increasing the access speed to the redundant bit line pairs and bit line pairs.

[Second Embodiment]

In the second embodiment, the present invention is applied to a shared sense amplifier scheme. In the shared sense amplifier scheme, a single sense amplifier is commonly used by pairs of bit lines BL and BBL in two memory cell arrays. With this arrangement, the number of sense amplifiers can be reduced, and a reduction of the number of circuits can be achieved.

Figure 19:
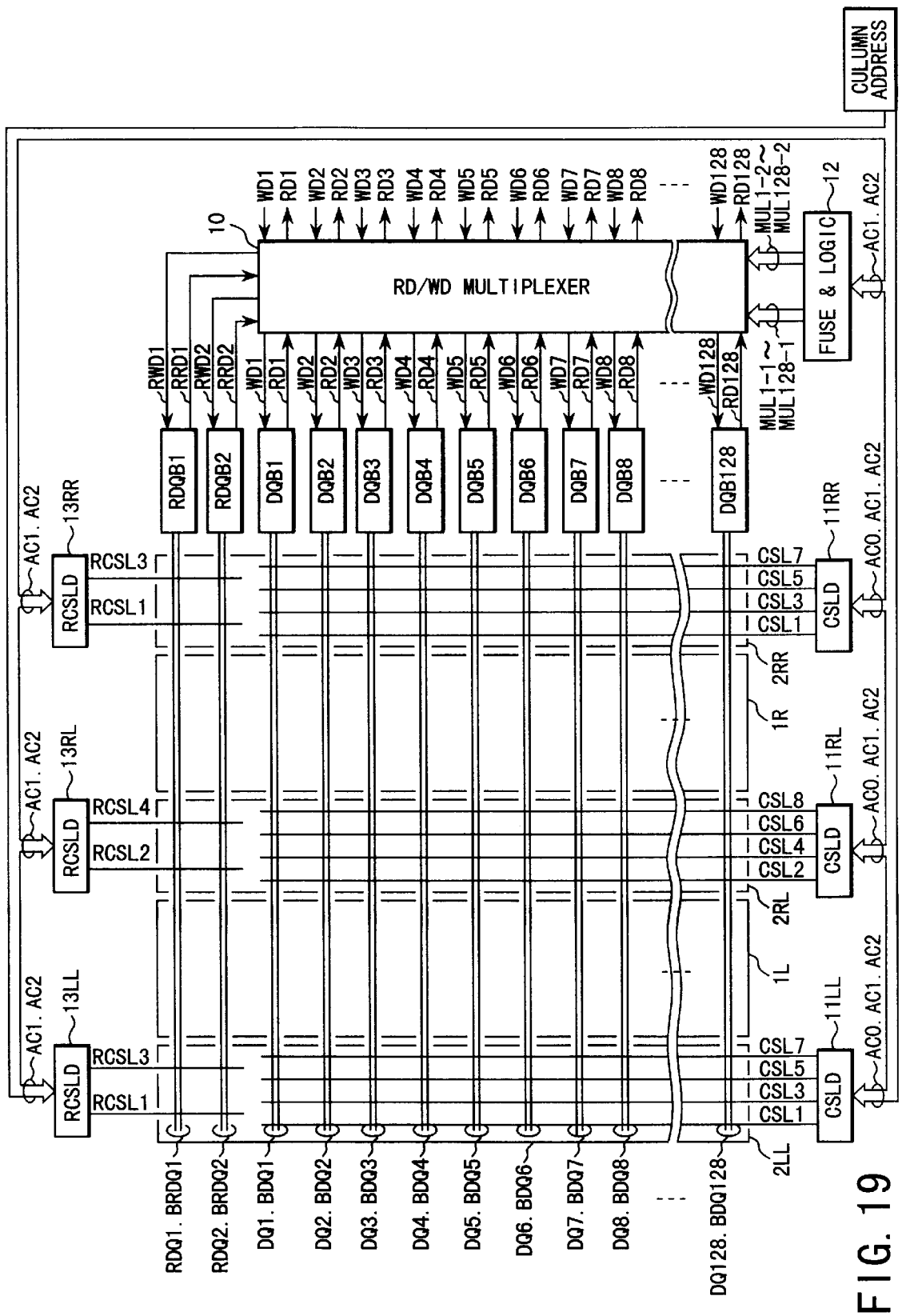
FIG. 19 is a block diagram of a DRAM according to the second embodiment of the present invention.

FIG. 19 is a block diagram of a DRAM according to the second embodiment of the present invention.

As shown in FIG. 19, the DRAM according to the second embodiment has column selector regions 2RR, 2RL, and 2LL. A memory cell/sense amplifier region 1R is placed between the column selector regions 2RR and 2RL, and a memory cell/sense amplifier region 1L is placed between the column selector regions 2RL and 2LL.

Column selection lines CSL1, CSL3, CSL5, and CSL7, and redundant column selection lines RCSL1 and RCSL3 run in the column selector regions 2RR and 2LL, and column selection lines CSL2, CSL4, CSL6, and CSL8, and redundant column selection lines RCSL2 and RCSL4 run in the column selector region 2RL.

The column selection lines CSL1, CSL3, CSL5, and CSL7 in the column selector region 2RR are connected to a column selection line driver 13RR, the column selection lines CSL1, CSL3, CSL5, and CSL7 in the column selector region 2LL to a column selection line driver 13LL, and the column selection lines CSL2, CSL4, CSL6, and CSL8 to a column selection line driver 13RL.

Similarly, the redundant column selection lines RCSL1 and RCSL3 in the column selector region 2RR are connected to a redundant column selection line driver 13RR, the redundant column selection lines RCSL1 and RCSL3 in the column selector region 2LL to a redundant column selection line driver 13LL, and the redundant column selection lines RSCL2 and RCSL4 in the column selector region 2RL to a redundant column selection line driver 13RL.

Note that the circuit arrangements of an RD/WD multiplexer 10 and replace control circuit 12 are the same as those in the first embodiment.

Figure 20:
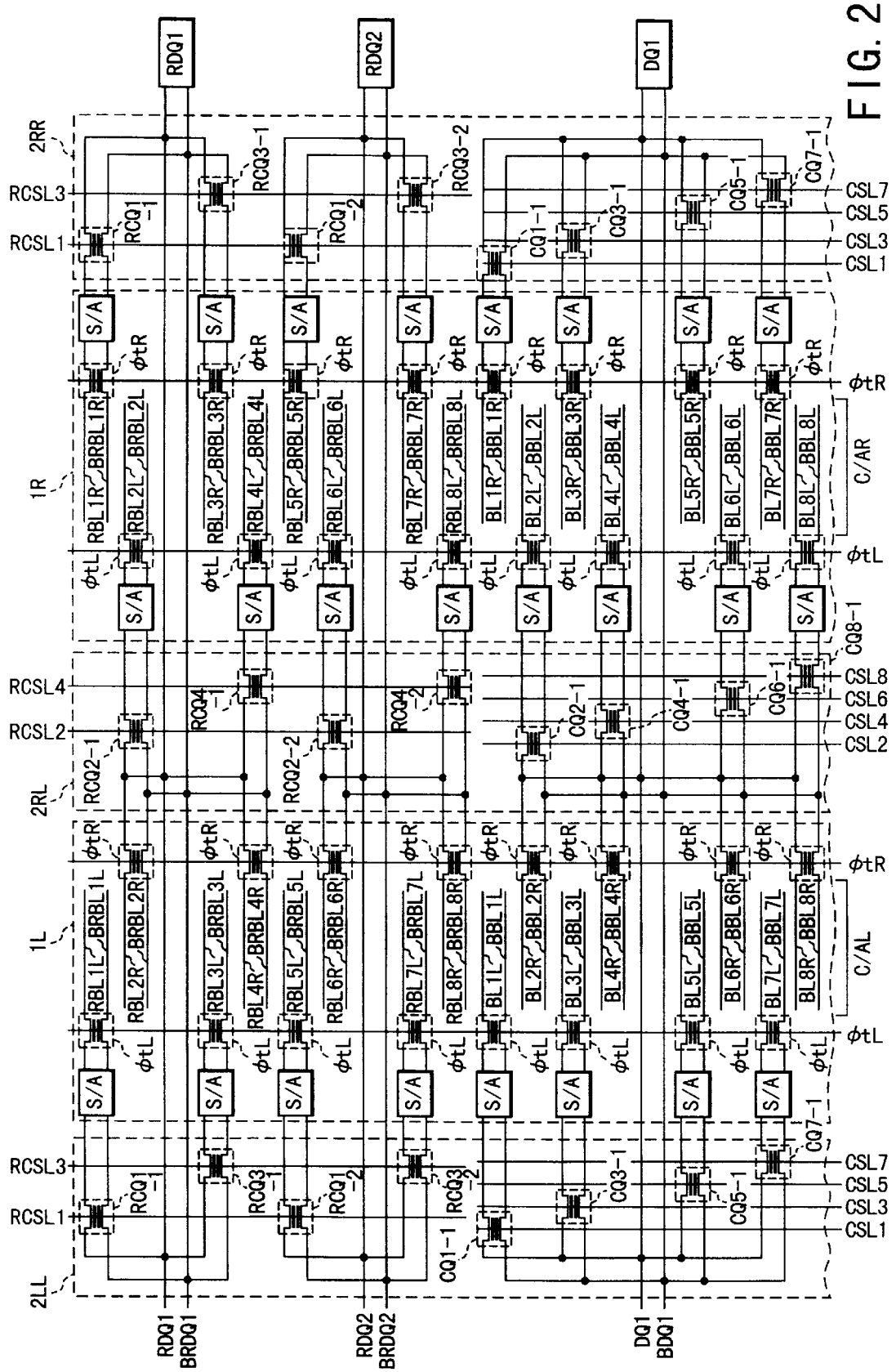
FIG. 20 is a circuit diagram of a memory cell/sense amplifier region and column selector region.

FIG. 20 is a circuit diagram showing a circuit example of the memory cell/sense amplifier region 1 and column selection region 2.

As shown in FIG. 20, the shared sense amplifier DRAM has gate circuits driven by a signal $\phi tR$ (to be referred to as gate circuits $\phi tR$ hereinafter), and gate circuits driven by a signal $\phi tL$ (to be referred to as gate circuits $\phi tL$ hereinafter). The gate circuits $\phi tR$ connect the bit line pairs (RBLR, BRBLR, BLR, BBLR) in a memory cell array C/AR to sense amplifiers S/A on the column selector region 2RR side, and those in a memory cell array C/AL to sense amplifiers S/A on the column selector region 2RL side. The gate circuits $\phi tL$ connect the bit line pairs (RBLL, BRBLL, BLL, BBLL) in the memory cell array C/AR to the sense amplifiers S/A on the column selection region 2RL side, and those in the memory cell array C/AL to sense amplifiers S/A on the column selector region 2LL side. The gate circuits $\phi tR$ and $\phi tL$ are common to the regular and redundant bit line pairs as well as word lines WL. Upon data read/write, the gate circuits $\phi tR$ and $\phi tL$ are selectively enabled. In this way, the sense amplifiers S/A on the column selector region 2RL side are commonly used by the pairs of bit lines BLL and BBLL in the memory cell array C/AR and the pairs of bit lines BLR and BBLR in the memory cell array C/AL.

The present invention can be applied to such shared sense amplifier DRAM.

Note that shared sense amplifier DRAMs are the currently mainstream ones. Hence, a shared sense amplifier DRAM will be exemplified in the embodiments to be described hereinafter.

[Third Embodiment]

The third embodiment relates to the layout of redundant column selection line drivers RCSLD.

In each of the DRAMs according to the first and second embodiments, the memory cell array/sense amplifier region 1 (or regions 1R and 1L) is inserted between the redundant column selection line drivers RCSLD and column selection line drivers CSLD.

Figure 21:
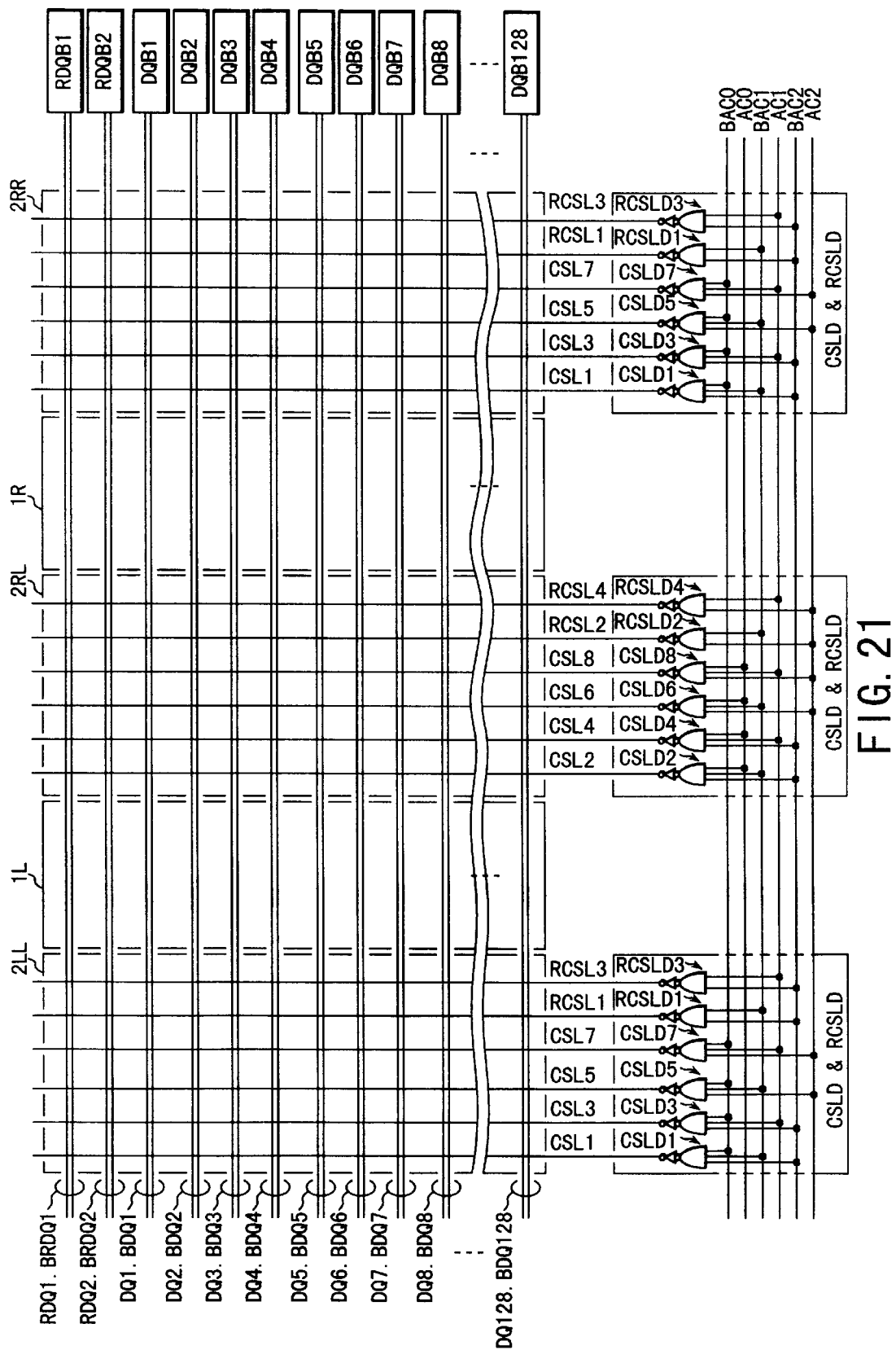
FIG. 21 is a block diagram of a DRAM according to the third embodiment of the present invention.

FIG. 21 is a block diagram of a DRAM according to the third embodiment of the present invention.

As shown in FIG. 21, redundant column selection line drivers RCSLD and regular column selection line drivers CSLD are not divisionally laid out on the semiconductor chip but are collectively laid out at identical position on the semiconductor chip. Redundant column selection lines RCSL run in the column selector regions 2RR, 2RL and 2LL parallel to regular column selection lines CSL. Regular column selection transistors CQ run underneath the regular column selection lines CSL, and redundant column selection transistors RCQ run underneath the redundant column selection lines RCSL.

With the arrangement of the third embodiment, since the redundant column selection lines RCSL run in the column selector regions 2RR, 2RL and 2LL parallel to the regular column selection lines CSL, the column selector regions 2RR, 2RL and 2LL require a larger area than in the second embodiments. However, a region for forming the redundant column selection line drivers RCSLD need not be assured on the chip.

To restate, both the layout of the redundant column selection line drivers RCSLD described in the first and second embodiment, and that described in the third embodiment have their respective merits. Hence, each actual DRAM need only select an optimal layout.

[Fourth Embodiment]

The objective of the Fourth embodiment is to improve the rescue efficiency without increasing the number of redundant bit line pairs.

Figure 22:
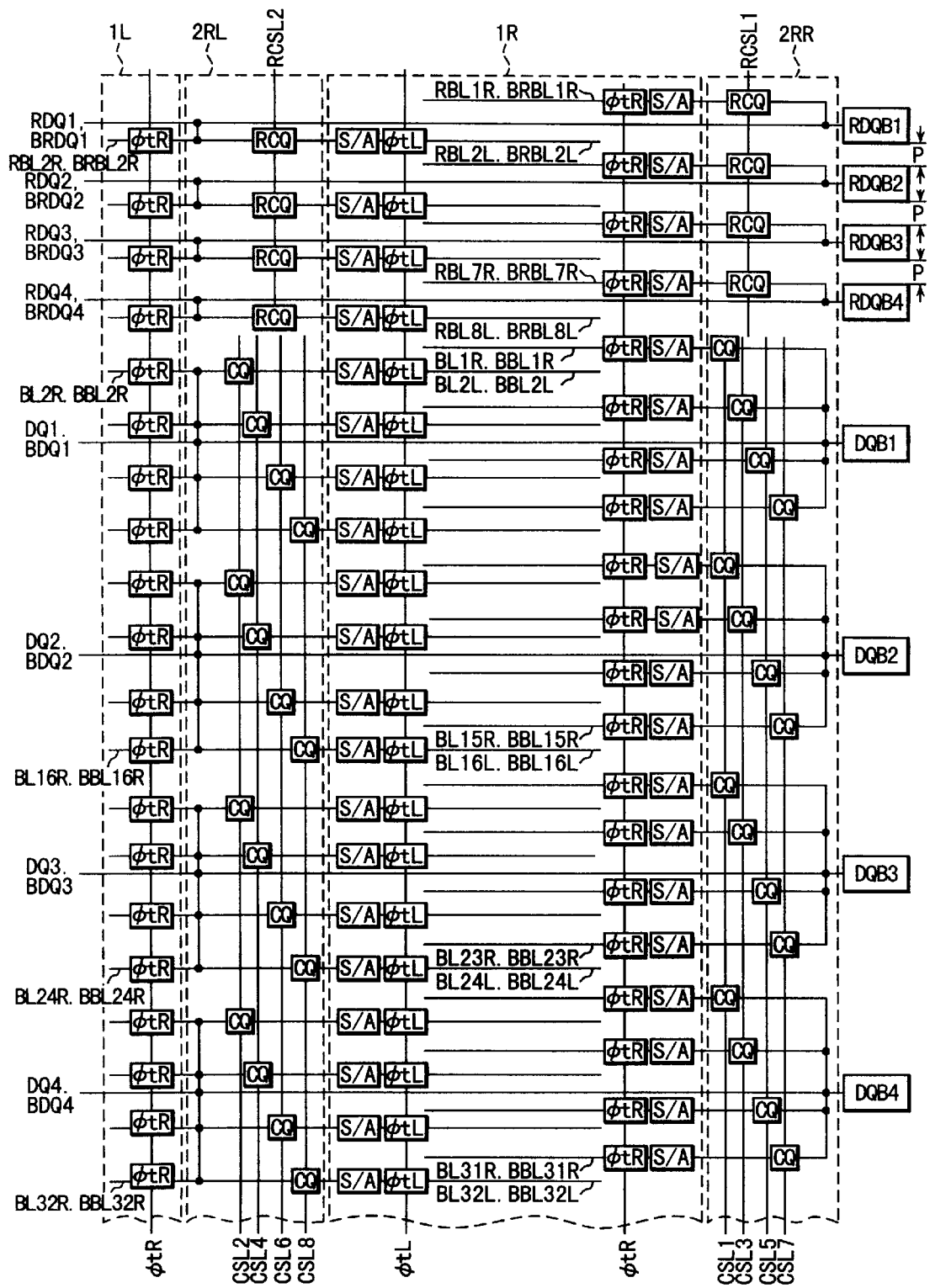
FIG. 22 is a block diagram of a DRAM according to the fourth embodiment of the present invention.

FIG. 22 is a circuit diagram showing a circuit example of a memory cell/sense amplifier regions 1R and 1L and column selector regions 2RR, 2RL and 2LL of a DRAM according to the Fourth embodiment.

In the first to third embodiments, eight redundant bit line pairs are selected by four redundant column selection lines RCSL.

By contrast, as shown in FIG. 22, in the DRAM according to the Fourth embodiment, eight redundant bit line pairs are selected by two redundant column selection lines RCSL. With this arrangement, the number of pairs of redundant data lines RDQ and BRDQ can be increased from two pairs to four pairs while the number of redundant bit line pairs remains the same.

According to the Fourth embodiment, by decreasing the number of redundant column selection lines RCSL, the number of pairs of redundant data lines RDQ and BRDQ can be increased while the number of redundant bit line pairs remains the same. Since the number of redundant data line pairs is increased, the rescue efficiency can be improved.

[Fifth Embodiment]

The fifth embodiment relates to the layout of pairs of redundant data lines RDQ and BRDQ.

In each of the DRAMs according to the first to fourth embodiments, the pairs of redundant data lines RDQ and BRDQ are laid out together on the end portion of the memory cell array/sense amplifier region 1 (or regions 1R and 1L).

Figure 23:
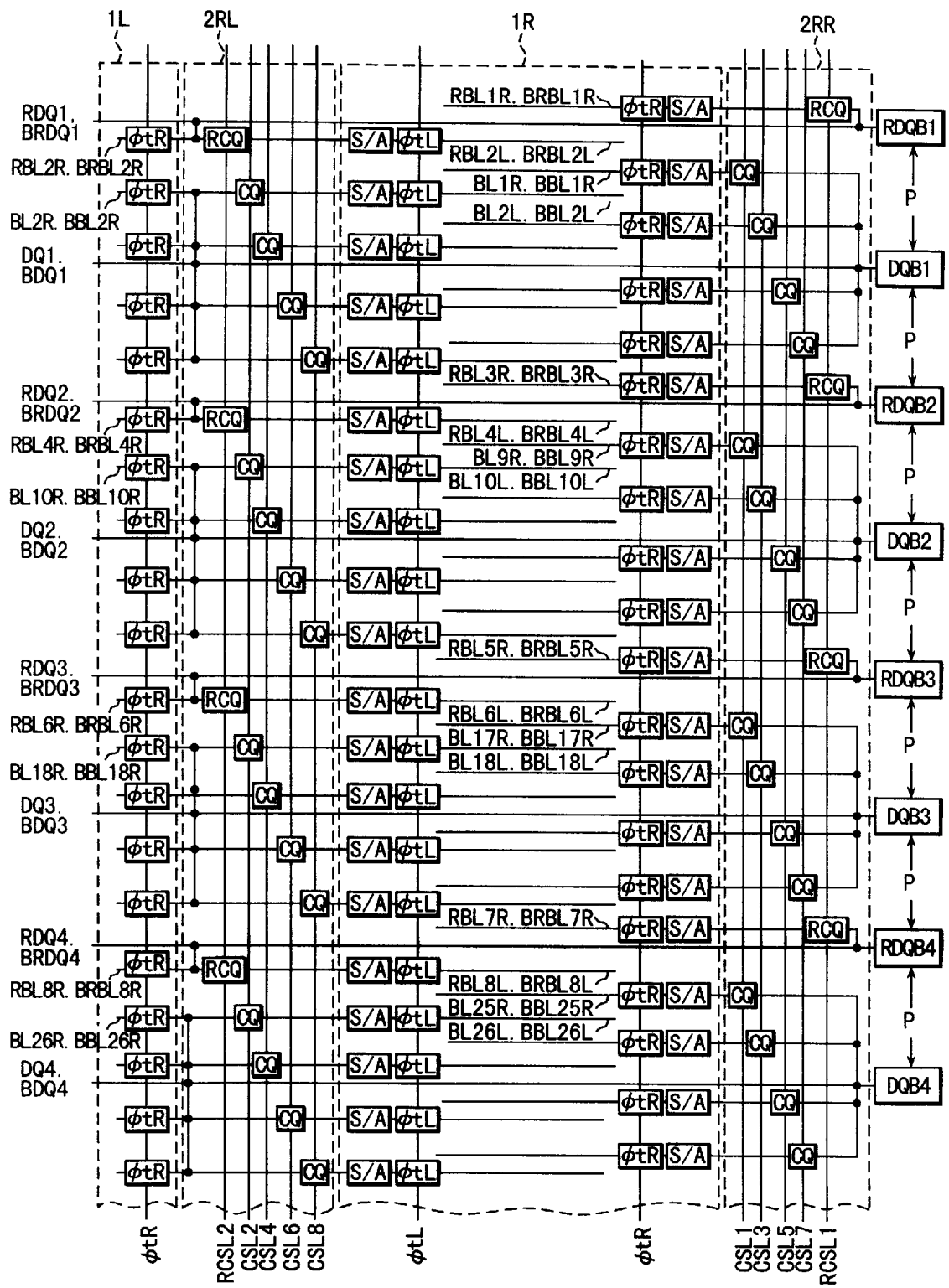
FIG. 23 is a block diagram of a DRAM according to the fifth embodiment of the present invention.

FIG. 23 is a block diagram of a DRAM according to the fifth embodiment of the present invention.

As shown in FIG. 23, in the DRAM according to the fifth embodiment, pairs of redundant data lines RDQ and BRDQ are dispersed in the memory cell array/sense amplifier regions 1R and 1L. Redundant column selection lines RCSL run in the column selector regions 2RR, 2RL and 2LL (FIG. 23 illustrates regions 2RR and 2RL) parallel to regular column selection lines CSL as in the fourth embodiment. Regular column selection transistors CQ run underneath the regular column selection lines CSL, and redundant column selection transistors RCQ run underneath the redundant column selection lines RCSL.

With the arrangement of the fifth embodiment, since the pairs of redundant data lines RDQ and BRDQ are dispersed in the memory cell array/sense amplifier regions 1R, 1L, the wire distance between the regular data line pair to be replaced and the redundant data line pair can be shortened as compared to the layout of the first to fourth embodiments. For this reason, no notable data delay is produced. Hence, the average operation speed of the DRAM can be improved.

In the present invention, the number of redundant bit line pairs connected to a redundant data line pair decreases depending on the number of regular bit line pairs connected to a regular data line pair. For this reason, the spacing between neighboring redundant data line buffers RDQB becomes smaller than that between neighboring regular data line buffers DBQ. When the pairs of redundant data lines RDQ and BRDQ are laid out together in the memory cell array/sense amplifier regions 1R and 1L, the spacing "p" between neighboring redundant data line buffers RDQB becomes especially smaller.

By contrast, in the fifth embodiment, since the redundant data line pairs and regular data line pairs mix with each other, the spacing "p" between the redundant data line buffer RDQB and regular data line buffer DQB does not become especially small.

[Sixth Embodiment]

The sixth embodiment relates to the layout of the column selection lines CSL and redundant column selection lines RCSL.

In the first to fifth embodiments, the column selection lines CSL and redundant column selection lines RCSL intersect the bit line and data line pairs.

Figure 24:
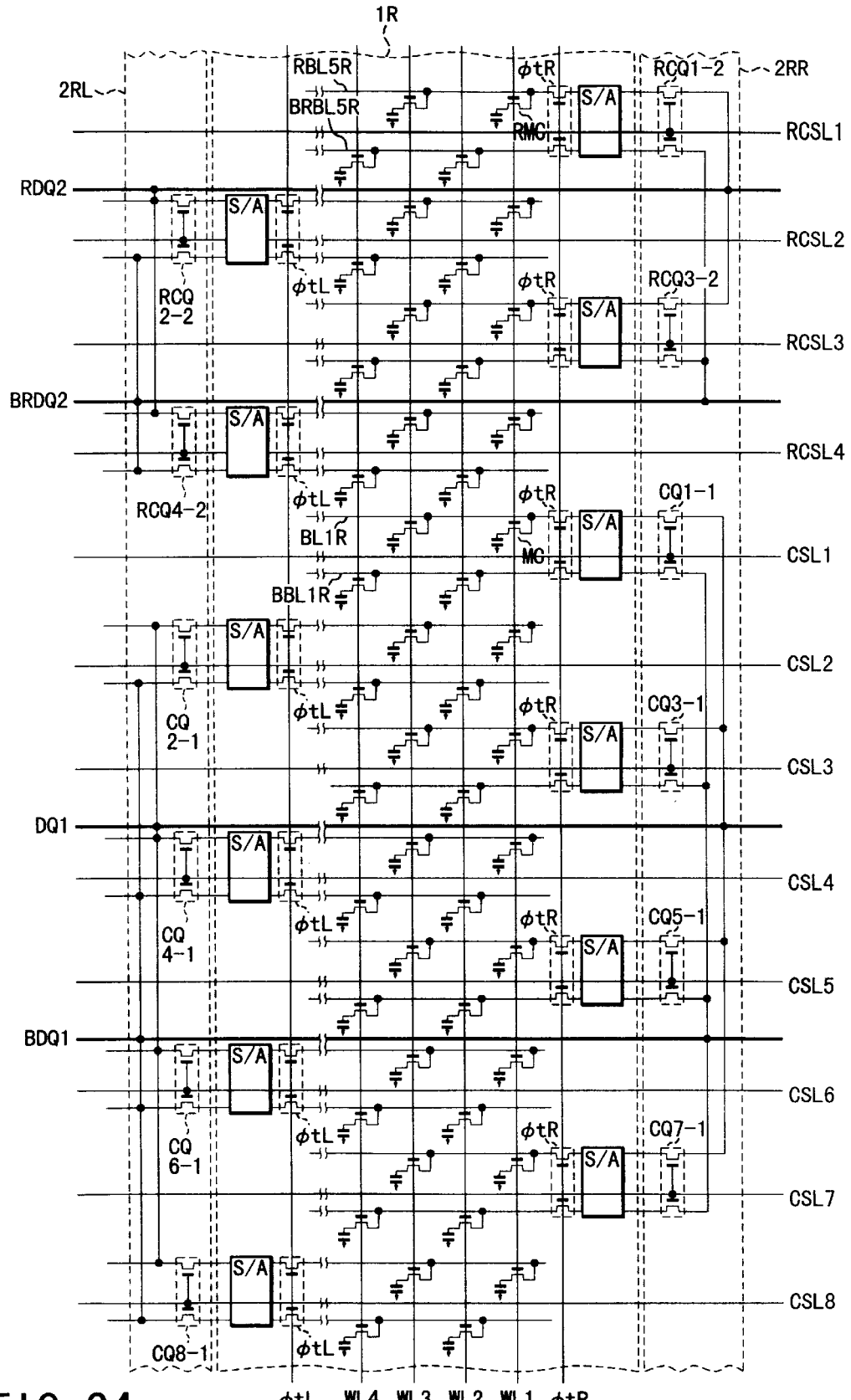
FIG. 24 is a circuit diagram of a DRAM according to the sixth embodiment of the present invention.

FIG. 24 is a circuit diagram of a DRAM according to the sixth embodiment of the present invention.

As shown in FIG. 24, in the DRAM according to the sixth embodiment, column selection lines CSL and redundant column selection lines RCSL respectively run parallel to the bit line and data line pairs.

With the layout of the sixth embodiment, since the column selection lines CSL and redundant column selection lines RCSL respectively run parallel to the bit line and data line pairs, column selection transistors CQ and redundant column selection transistors can be lined up. For this reason, even when the numbers of column selection lines CSL and redundant column selection lines RCSL increase, the column selector regions 2RR, 2RL and 2LL (FIG. 24 illustrates regions 2RR and 2RL) can be prevented from broadening along the bit line pairs.

[Seventh Embodiment]

The seventh embodiment relates to the layout of the data line and redundant data line pairs.

In the first to sixth embodiments, the pairs of data lines DQ and BDQ, and the pairs of redundant data lines RDQ and BRDQ are laid out parallel to the bit line pairs and column selection lines.

Figure 25:
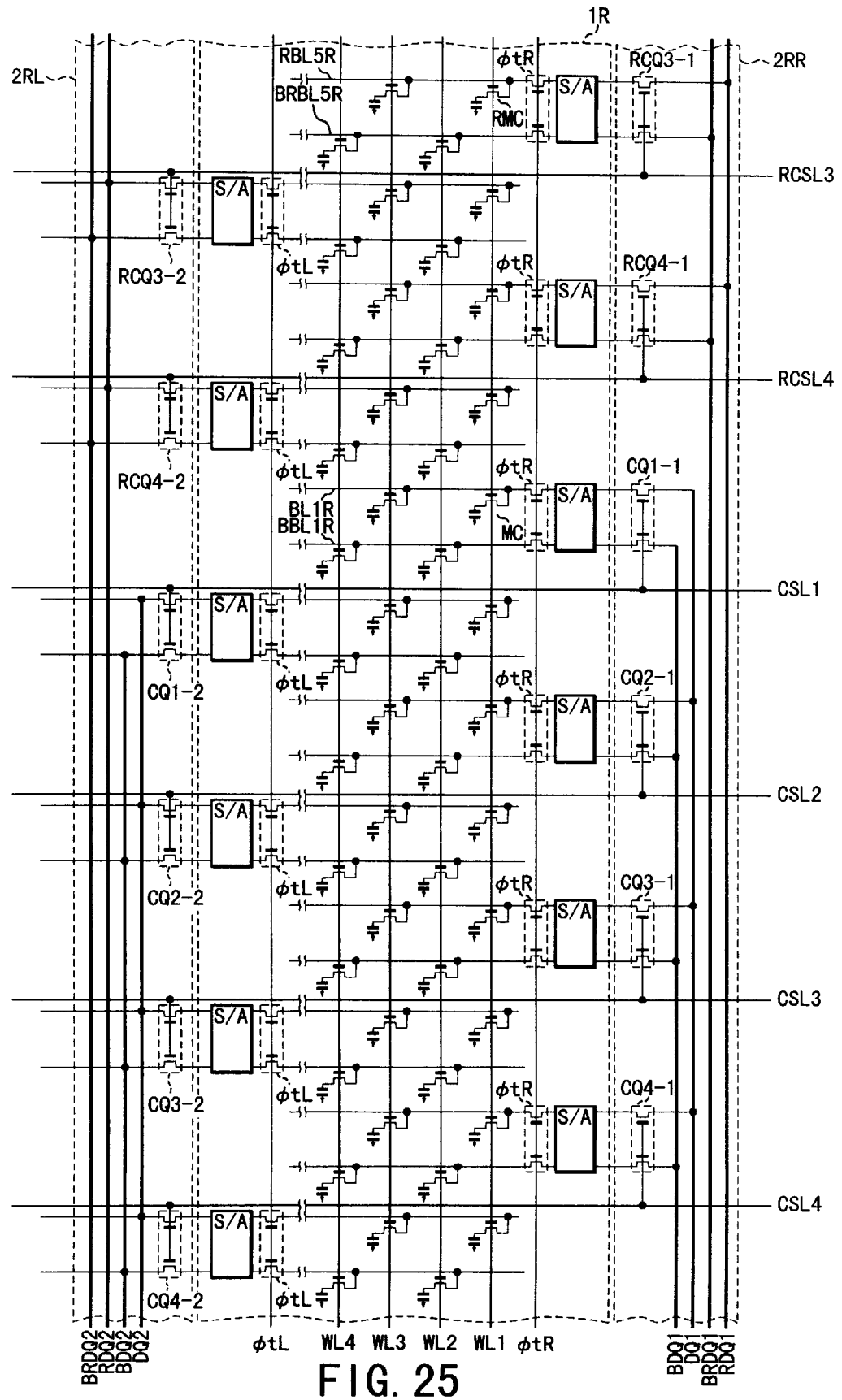
FIG. 25 is a circuit diagram of a DRAM according to the seventh embodiment of the present invention.

FIG. 25 is a circuit diagram of a DRAM according to the seventh embodiment of the present invention.

As shown in FIG. 25, in the DRAM according to the seventh embodiment, the pairs of data lines DQ and BDQ, and pairs of redundant data lines RDQ and BRDQ intersect the bit line pairs and column selection lines.

Such layout of the seventh embodiment is effective when the number of pairs of data lines DQ and BDQ is small.

Note that the layout in which the column selection lines run in a direction perpendicular to the bit line and data line pairs as in the first to fifth embodiments is suitable for a case wherein, for example, the number of column selection lines is small, and the number of I/O terminals of the memory is large (the number of data line pairs is large).

On the other hand, the layout in which the data line pairs run in a direction perpendicular to the column selection lines and the bit line pairs as in the seventh embodiment is suitable for a case wherein, for example, the number of column selection lines is small, and the number of I/O terminals of the memory is small (the number of data line pairs is small).

Furthermore, the layout in which all the column selection lines and bit line and data line pairs run parallel to each other as in the sixth embodiment is suitable for a case wherein, for example, the numbers of column selection lines and I/O terminals of the memory are in the middle between the aforementioned two cases.

The present invention can be applied to any layouts of the first to fifth, sixth, and seventh embodiments.

In the first to seventh embodiments, a column failure is rescued by replacing a column. Even when a row failure is rescued by replacing a row, a redundant memory cell selection circuit for selecting a redundant memory cell in a selection unit smaller than that of a regular memory cell by a regular memory cell selection circuit for selecting the regular memory cell is added, thus improving failure rescue efficiency upon rescuing a failed portion of the regular memory cell by replacing it by the redundant memory cell.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array having a plurality of memory cells arranged in a matrix, said plurality of memory cells including regular memory cells and redundant memory cells for failure rescue;
a plurality of regular bit lines connected to said regular memory cells;
at least one redundant bit line connected to said redundant memory cells;
a regular data line coupled to said plurality of regular bit lines;
a redundant data line coupled to said at least one redundant bit line;
a regular column selection circuit which selects one of said plurality of regular bit lines to connect said regular data line; and
a redundant column selection circuit which selects one of said least one redundant bit line to connect said redundant data line, wherein
the number of said at least one redundant bit line is smaller than the number of said plurality of regular bit lines.

2. A semiconductor memory device comprising:
a memory cell array having a plurality of memory cells arranged in a matrix, said plurality of memory cells including regular memory cells and redundant memory cells for failure rescue;
n regular bit lines connected to said regular memory cells, where n is an integer;
m redundant bit lines connected to said redundant memory cells, where m is an integer less than n;
a plurality of word lines connected to said regular memory cells and said redundant memory cells;
a regular data line coupled to said n regular bit lines;
a redundant data line coupled to said m redundant bit lines;
a regular column selection circuit which selects one of said n regular bit lines to connect said regular data line;
a redundant column selection circuit which selects one of said m redundant bit lines to connect said redundant data line;
a multiplexer which selects one of said regular data line and said redundant data line; and
a replace control circuit which controls said multiplexer to select said redundant data line in place of said regular data line.

3. The device according to claim 2, further comprising:
n regular column selection transistors which are respectively connected to said n regular bit lines;
m redundant column selection transistors which are respectively connected to said m redundant bit lines; and
m redundant column selection lines which are respectively connected to said m redundant column selection transistors, wherein,
a regular column selection circuit comprises nr regular column selection line drivers which are respectively connected to said n regular column selection lines and m redundant column selection line drivers which are respectively connected to said m redundant column selection lines.

4. The device according to claim 3, further comprising:
a plurality of sense amplifiers which are respectively connected to said n regular bit lines and said m redundant bit lines.

5. The device according to claim 4, wherein said n regular bit lines and m redundant bit lines are arranged in a first direction, and said plurality of word lines are arranged in a second direction perpendicular to the first direction.

6. The device according to claim 5, wherein said n regular column selection line drivers and said m redundant column selection line drivers independently operate.

7. The device according to claim 6, wherein said n regular column selection line drivers decode a column address to selectively drive one of said n regular column selection lines, and m redundant column selection line drivers decode some bits of the column address to selectively drive one of said m redundant column selection lines.

8. The device according to claim 5, wherein said n regular column selection line drivers are laid out on one end side of said memory cell array, and said m redundant column selection line drivers are laid out on the other end side opposite to the one end side.

9. The device according to claim 5, wherein said n regular column selection line drivers and said m redundant column selection line drivers are respectively laid out on one end side of said memory cell array.

10. A semiconductor memory device comprising:
   a memory cell array having a plurality of memory cells arranged in a matrix, said plurality of memory cells including regular memory cells and redundant memory cells for failure rescue;
   a plurality of regular bit lines connected to said regular memory cells;
   a plurality of redundant bit lines connected to said redundant memory cells;
   a plurality of regular data lines each commonly coupled to n regular bit lines of said regular bit lines, where n is an integer;
   a plurality of redundant data lines each commonly coupled to m redundant bit lines of said redundant bit lines, where m is an integer less than n;
   a regular column selection circuit which selects one of said n regular bit lines to connect said plurality of regular data lines; and
   a redundant column selection circuit which selects one of said m regular bit lines to connect said plurality of redundant data lines.

11. The device according to claim 10, wherein said plurality of regular data lines and redundant data lines are dispersed above said memory cell array.

12. The device according to claim 5, wherein said regular data line and said redundant data line run along said first direction, and said n regular column selection lines and said m redundant column selection lines run along said second direction.

13. The device according to claim 5, wherein said regular data line and said redundant data line run along said second direction, and said n regular column selection lines and said m redundant column selection lines run along said first direction.

14. The device according to claim 5, wherein said regular data line, said redundant data line, said n regular column selection lines and said m redundant column selection lines run along said first direction.

15. The device according to claim 5, wherein each of said regular memory cells is comprised of a capacitor and a transistor which is connected in series between said capacitor and regular bit line, and has a gate connected to the word line, and
   each of said redundant memory cells is comprise of a capacitor and a transistor which is connected in series between said capacitor and redundant bit line, and has a gate connected to the word line.

16. The device according to claim 5, wherein said replace control circuit has a program circuit programmed with a column address of the failed memory cell.

17. The device according to claim 16, wherein said program circuit includes a fuse.

18. The device according to claim 16, wherein said program circuit is programmed with some bits of the column address of the failed memory cell.

19. The device according to claim 5, wherein each of said sense amplifier comprises a shared sense amplifier.

20. The device according to claim 10, wherein said plurality of regular data lines are laid out together above said memory cell array and on one end side of said memory cell array, said plurality of redundant data lines are laid out together above said memory cell array and on the other end side opposite to the one end side of said memory cell array.

* * * * *

UNITED STATES PATENT AND TRADEMARK OFFICE
CERTIFICATE OF CORRECTION

PATENT NO.: 6,104,646
DATED: August 15, 2000
INVENTOR: Ryo HAGA

It is certified that errors appear in the above-identified patent and that said Letters Patent is hereby corrected as shown below:

In Claim 1, column 16, line 2, immediately before "least", --at-- has been inserted.

In Claim 3, column 16, line 43, "nr" has been deleted and in its place --n-- has been inserted.

In Claim 10, column 17, line 22, "in" has been deleted and in its place --m-- has been inserted.

In Claim 15, column 18, line 16, "comprise" has been deleted and in its place --comprised-- has been inserted.

Signed and Sealed this

First Day of May, 2001

Attest:

NICHOLAS P. GODICI

Attesting Officer

Acting Director of the United States Patent and Trademark Office